(12) United States Patent
Yu et al.

(10) Patent No.: US 10,541,226 B2
(45) Date of Patent: Jan. 21, 2020

(54) PACKAGE STRUCTURE AND METHOD OF FORMING THE SAME

(71) Applicant: Taiwan Semiconductor Manufacturing Company, Ltd., Hsin-Chu (TW)

(72) Inventors: Chen-Hua Yu, Hsin-Chu (TW); Li-Hsien Huang, Zhubei (TW); Chi-Hsi Wu, Hsin-Chu (TW); Der-Chyang Yeh, Hsin-Chu (TW); Hsien-Wei Chen, Hsin-Chu (TW); An-Jhih Su, Taoyuan (TW); Hua-Wei Tseng, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/284,266

(22) Filed: Oct. 3, 2016

(65) Prior Publication Data
US 2018/0033771 A1 Feb. 1, 2018

Related U.S. Application Data

(60) Provisional application No. 62/368,640, filed on Jul. 29, 2016.

(51) Int. Cl.
*H01L 25/065* (2006.01)
*H01L 21/56* (2006.01)
(Continued)

(52) U.S. Cl.
CPC ........ *H01L 25/0652* (2013.01); *H01L 21/563* (2013.01); *H01L 21/565* (2013.01);
(Continued)

(58) Field of Classification Search
CPC ................. H01L 21/563; H01L 21/565; H01L 21/76885; H01L 23/3128; H01L 23/3121;
(Continued)

(56) References Cited

U.S. PATENT DOCUMENTS 8,354,340 B2 * 1/2013 Kurita ................. H01L 21/6835
438/620
8,648,469 B2 * 2/2014 Choi ....................... H01L 24/29
257/685

(Continued)

FOREIGN PATENT DOCUMENTS

CN 103187394 A 7/2013
CN 105789062 A 7/2016

*Primary Examiner* — Zandra V Smith
*Assistant Examiner* — Abbigale A Boyle
(74) *Attorney, Agent, or Firm* — Slater Matsil, LLP

(57) ABSTRACT

An embodiment is a structure including a first die, a molding compound at least laterally encapsulating the first die, a first redistribution structure including metallization patterns extending over the first die and the molding compound, a first conductive connector comprising a solder ball and an under bump metallization coupled to the first redistribution structure, and an integrated passive device bonded to a first metallization pattern in the first redistribution structure with a micro bump bonding joint, the integrated passive device being adjacent the first conductive connector.

19 Claims, 28 Drawing Sheets

(51) Int. Cl.
    *H01L 23/00* (2006.01)
    *H01L 25/00* (2006.01)
    *H01L 25/16* (2006.01)
    *H01L 25/10* (2006.01)
    *H01L 23/31* (2006.01)

(52) U.S. Cl.
    CPC ........ *H01L 21/568* (2013.01); *H01L 23/3114* (2013.01); *H01L 23/3128* (2013.01); *H01L 24/19* (2013.01); *H01L 24/20* (2013.01); *H01L 25/105* (2013.01); *H01L 25/16* (2013.01); *H01L 25/50* (2013.01); *H01L 2224/04105* (2013.01); *H01L 2224/05147* (2013.01); *H01L 2224/05166* (2013.01); *H01L 2224/05184* (2013.01); *H01L 2224/12105* (2013.01); *H01L 2224/13014* (2013.01); *H01L 2224/13016* (2013.01); *H01L 2224/13024* (2013.01); *H01L 2224/13111* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/13164* (2013.01); *H01L 2224/32145* (2013.01); *H01L 2224/32225* (2013.01); *H01L 2224/48227* (2013.01); *H01L 2224/73265* (2013.01); *H01L 2224/73267* (2013.01); *H01L 2224/97* (2013.01); *H01L 2225/0651* (2013.01); *H01L 2225/06568* (2013.01); *H01L 2225/1035* (2013.01); *H01L 2225/1041* (2013.01); *H01L 2225/1058* (2013.01); *H01L 2924/15311* (2013.01); *H01L 2924/19011* (2013.01)

(58) Field of Classification Search
    CPC . H01L 23/3114; H01L 24/19; H01L 25/0657; H01L 25/0652; H01L 25/16; H01L 2224/16265; H01L 2224/16268; H01L 2224/04105; H01L 2224/12105
    See application file for complete search history.

(56) References Cited

U.S. PATENT DOCUMENTS

| | | | |
|---|---|---|---|
| 2009/0108433 A1* | 4/2009 | Masumoto | H01L 21/563 257/690 |
| 2010/0065846 A1 | 3/2010 | Satoh | |
| 2010/0140736 A1* | 6/2010 | Lin | H01L 23/3128 257/528 |
| 2013/0062761 A1* | 3/2013 | Lin | H01L 23/49816 257/738 |
| 2013/0093097 A1* | 4/2013 | Yu | H01L 21/568 257/774 |
| 2013/0168805 A1 | 7/2013 | Yu et al. | |
| 2014/0264839 A1 | 9/2014 | Tsai et al. | |
| 2016/0071820 A1 | 3/2016 | Yu et al. | |
| 2016/0329262 A1* | 11/2016 | Hsiao | H01L 23/49894 |
| 2017/0098589 A1* | 4/2017 | Liu | H01L 23/544 |

* cited by examiner

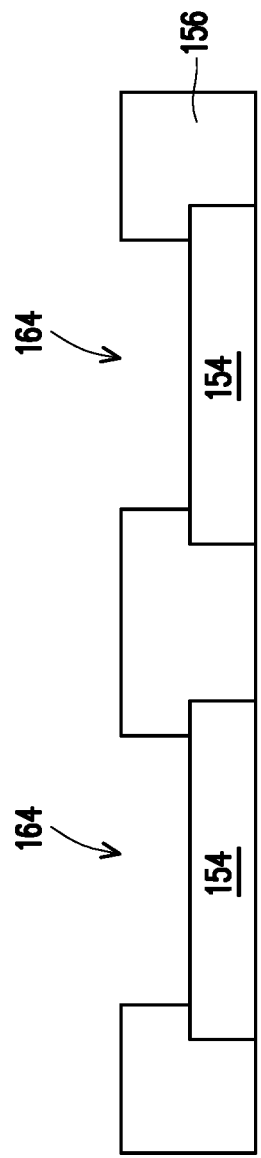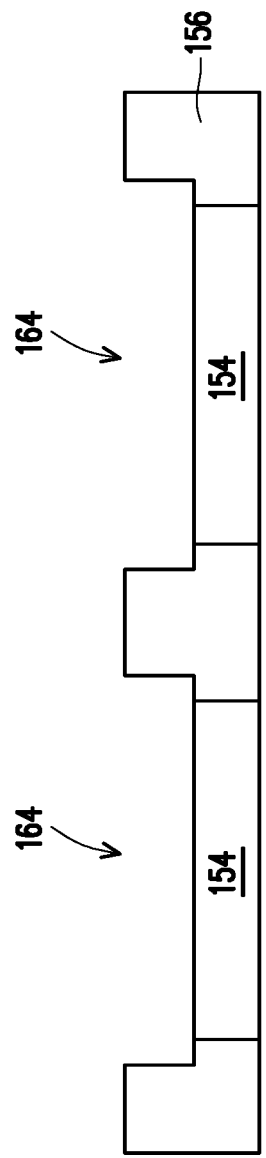

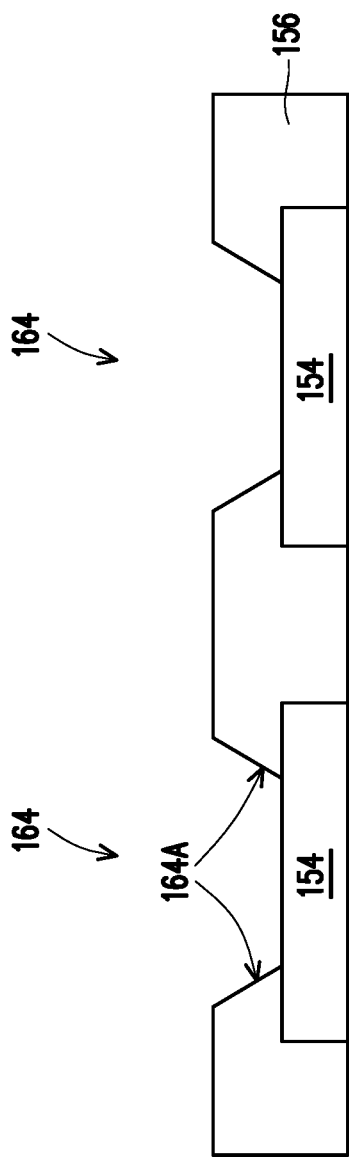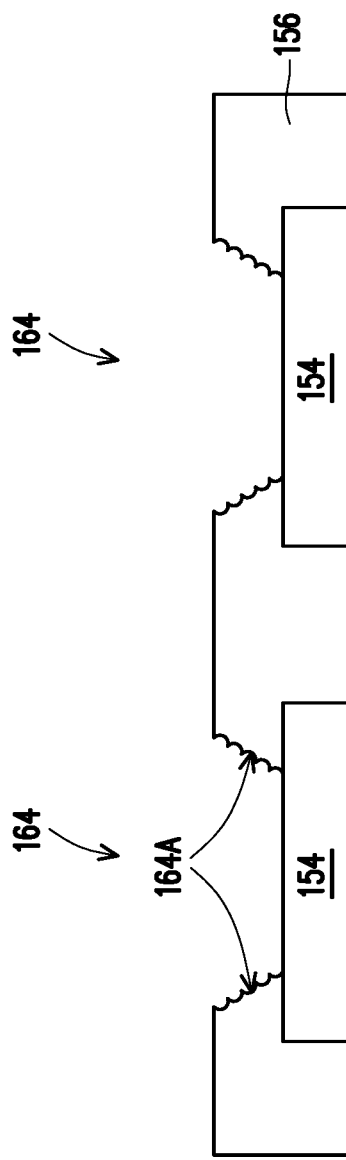

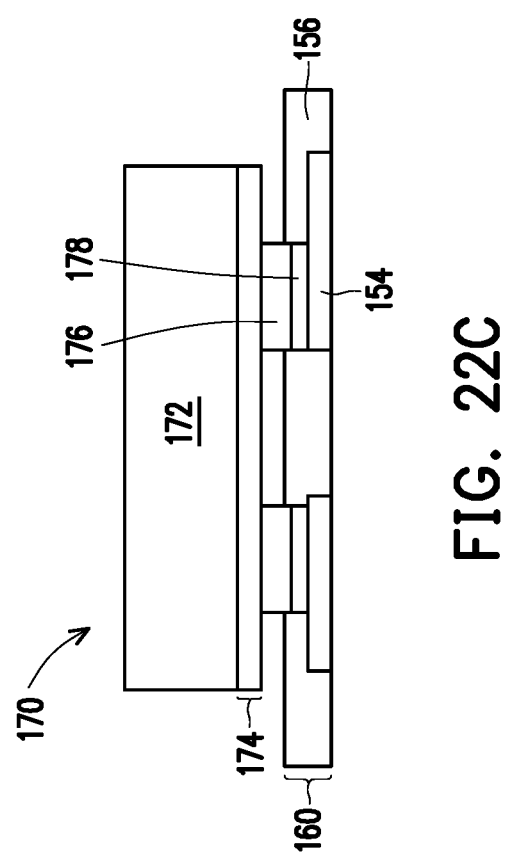

US 10,541,226 B2

PACKAGE STRUCTURE AND METHOD OF FORMING THE SAME

PRIORITY CLAIM AND CROSS-REFERENCE

This application claims the benefit to U.S. Provisional Patent Application No. 62/368,640, filed on Jul. 29, 2016, and entitled "Package Structure and Method of Forming the Same," which application is incorporated herein by reference.

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. PoP technology generally enables production of semiconductor devices with enhanced functionalities and small footprints on a printed circuit board (PCB).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 19A through 19D illustrate cross-sectional views of passivation openings in accordance with some embodiments.

FIGS. 22A through 22C illustrate cross-sectional views of underfill schemes for integrated passive devices in accordance with some embodiments.

DETAILED DESCRIPTION

Figure 1:
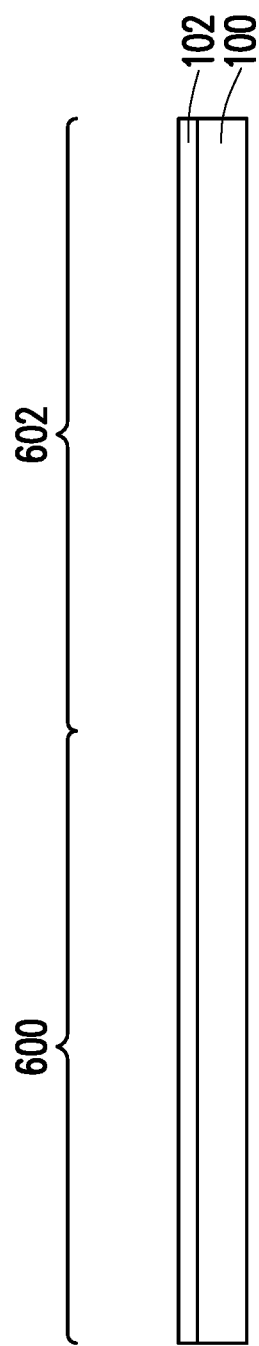
FIGS. 1 through 18, 20A, 20B, and 23-26 illustrate cross-sectional views of intermediate steps during a process for forming a package structure in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments discussed herein may be discussed in a specific context, namely a package structure including an integrated passive device (IPD) design that increases system performance and enlarges the process window to improve reliability and yield of the package structure. The package structures may include a fan-out or fan-in package and may include one or more redistribution layers (RDLs). The IPD component may be bonded to the one or more RDLs of the package structure. The IPD component may be bonded to the one or more RDLS adjacent a conductive joint that couples and bonds two packages/substrates together. The adjacent conductive joint may include an under bump metallization (UBM) on the one or more RDLs and a solder joint coupled to the UBM. The IPD component may be bonded to the one or more RDLs without any UBM. The IPD component may be bonded and electrically coupled to one of the conductive layers of the RDLs with a micro bump joint that includes a solder layer. In some embodiments, the IPD component may comprise capacitor, resistor, inductor, the like, or a combination thereof.

In some embodiments, the IPD component includes extra back-end-of-line (BEOL) metal routings to further boost system performance. However, with the extra metal routing, the height of the IPD component can become an issue on board level joint yield. Thus, by removing the UBM under the IPD component joint area, the total height of the IPD component is reduced and the process window is enlarged. A laser drill or photolithography process may be utilized to forming openings in passivation or polymer layers to expose the conductive layer of the RDL that the IPD component will be bonded. In addition, full-fill, partial-fill and no-fill of underfill of IPD components may be utilized to prevent contamination and to improve reliability.

Further, the teachings of this disclosure are applicable to any package structure including an IPD component. Other embodiments contemplate other applications, such as different package types or different configurations that would be readily apparent to a person of ordinary skill in the art upon reading this disclosure. It should be noted that embodiments discussed herein may not necessarily illustrate every component or feature that may be present in a structure. For example, multiples of a component may be omitted from a figure, such as when discussion of one of the component may be sufficient to convey aspects of the embodiment. Further, method embodiments discussed herein may be discussed as being performed in a particular order; however, other method embodiments may be performed in any logical order.

FIGS. 1 through 18, 20, and 23-26 illustrate cross-sectional views of intermediate steps during a process for forming a package structure in accordance with some embodiments. FIG. 1 illustrates a carrier substrate 100 and a release layer 102 formed on the carrier substrate 100. A first package region 600 and a second package region 602 for the formation of a first package and a second package, respectively, are illustrated.

The carrier substrate 100 may be a glass carrier substrate, a ceramic carrier substrate, or the like. The carrier substrate 100 may be a wafer, such that multiple packages can be formed on the carrier substrate 100 simultaneously. The release layer 102 may be formed of a polymer-based material, which may be removed along with the carrier substrate 100 from the overlying structures that will be formed in subsequent steps. In some embodiments, the release layer 102 is an epoxy-based thermal-release material, which loses its adhesive property when heated, such as a light-to-heat-conversion (LTHC) release coating. In other embodiments, the release layer 102 may be an ultra-violet (UV) glue, which loses its adhesive property when exposed to UV lights. The release layer 102 may be dispensed as a liquid and cured, may be a laminate film laminated onto the carrier substrate 100, or may be the like. The top surface of the release layer 102 may be leveled and may have a high degree of coplanarity.

Figure 2:
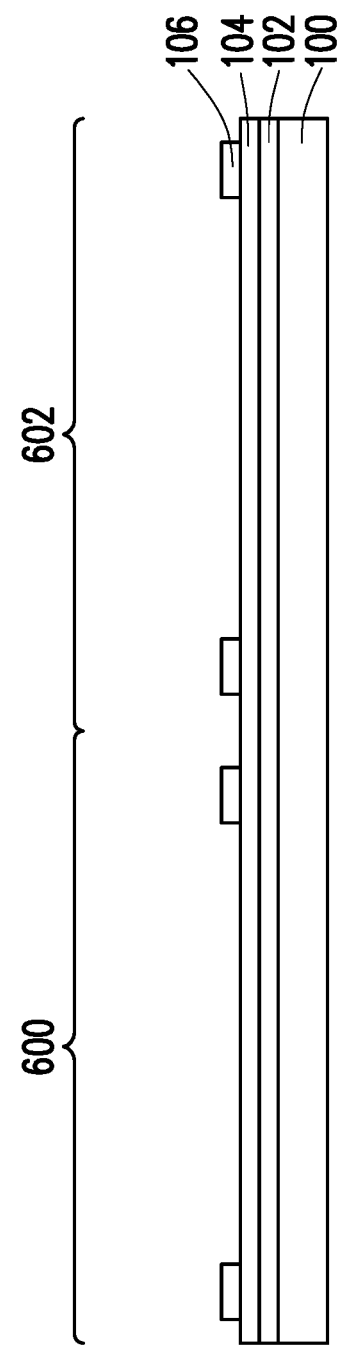

In FIG. 2, a dielectric layer 104 and a metallization pattern 106 are formed. As illustrated in FIG. 2, a dielectric layer 104 is formed on the release layer 102. The bottom surface of the dielectric layer 104 may be in contact with the top surface of the release layer 102. In some embodiments, the dielectric layer 104 is formed of a polymer, such as polybenzoxazole (PBO), polyimide, benzocyclobutene (BCB), or the like. In other embodiments, the dielectric layer 104 is formed of a nitride such as silicon nitride; an oxide such as silicon oxide, phosphosilicate glass (PSG), borosilicate glass (BSG), boron-doped phosphosilicate glass (BPSG), or the like; or the like. The dielectric layer 104 may be formed by any acceptable deposition process, such as spin coating, chemical vapor deposition (CVD), laminating, the like, or a combination thereof.

The metallization pattern 106 is formed on the dielectric layer 104. As an example to form metallization pattern 106, a seed layer (not shown) is formed over the dielectric layer 104. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 106. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 106.

Figure 3:
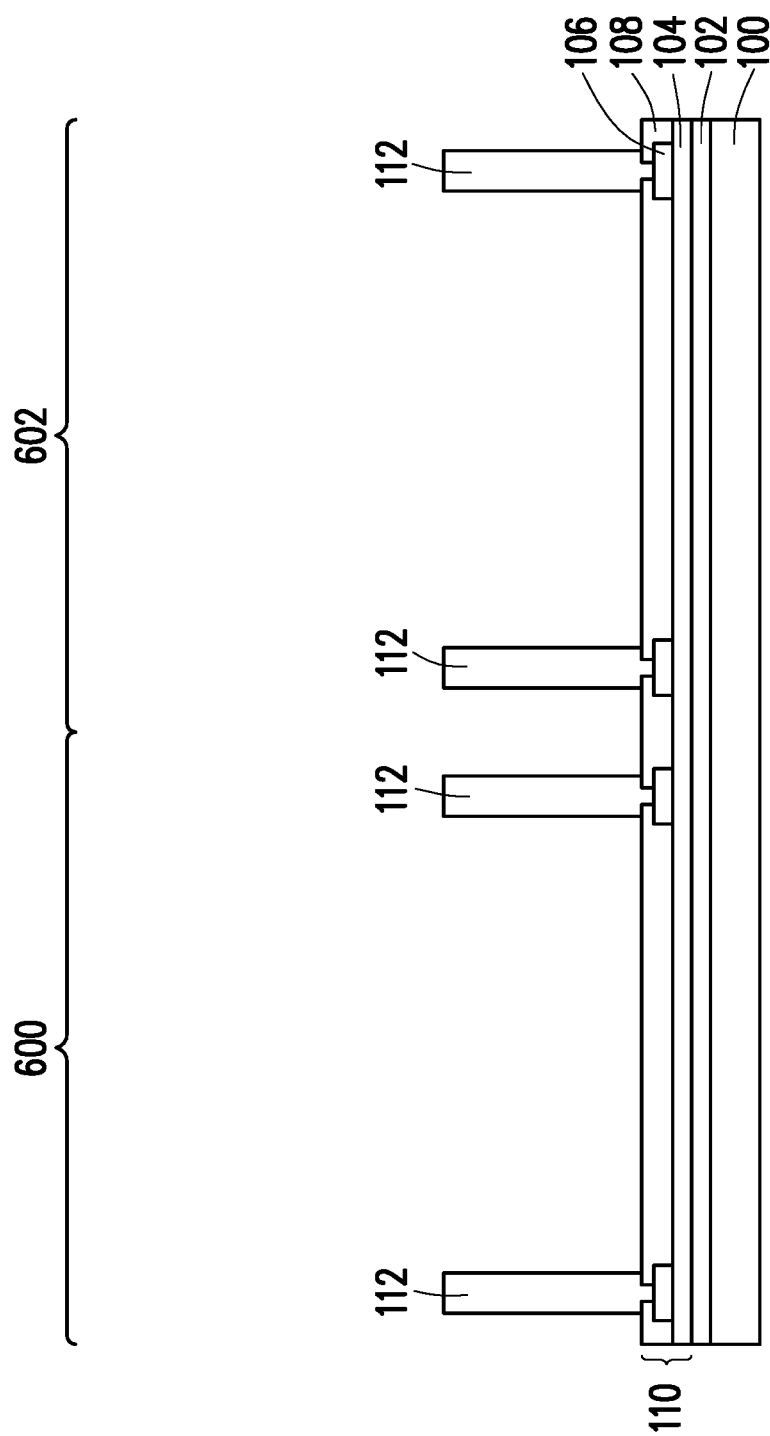

In FIG. 3, a dielectric layer 108 is formed on the metallization pattern 106 and the dielectric layer 104. In some embodiments, the dielectric layer 108 is formed of a polymer, which may be a photo-sensitive material such as PBO, polyimide, BCB, or the like, that may be patterned using a lithography mask. In other embodiments, the dielectric layer 108 is formed of a nitride such as silicon nitride; an oxide such as silicon oxide, PSG, BSG, BPSG; or the like. The dielectric layer 108 may be formed by spin coating, lamination, CVD, the like, or a combination thereof. The dielectric layer 108 is then patterned to form openings to expose portions of the metallization pattern 106. The patterning may be by an acceptable process, such as by exposing the dielectric layer 108 to light when the dielectric layer is a photo-sensitive material or by etching using, for example, an anisotropic etch.

The dielectric layers 104 and 108 and the metallization patterns 106 may be referred to as a back-side redistribution structure 110. As illustrated, the back-side redistribution structure 110 includes the two dielectric layers 104 and 108 and one metallization pattern 106. In other embodiments, the back-side redistribution structure 110 can include any number of dielectric layers, metallization patterns, and vias. One or more additional metallization pattern and dielectric layer may be formed in the back-side redistribution structure 110 by repeating the processes for forming a metallization patterns 106 and dielectric layer 108. Vias may be formed during the formation of a metallization pattern by forming the seed layer and conductive material of the metallization pattern in the opening of the underlying dielectric layer. The vias may therefore interconnect and electrically couple the various metallization patterns.

Further in FIG. 3, through vias 112 are formed. As an example to form the through vias 112, a seed layer is formed over the back-side redistribution structure 110, e.g., the dielectric layer 108 and the exposed portions of the metallization pattern 106 as illustrated. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is formed and patterned on the seed layer. The photo resist may be formed by spin coating or the like and may be exposed to light for patterning. The pattern of the photo resist corresponds to through vias. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. The photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form through vias 112.

Figure 4:
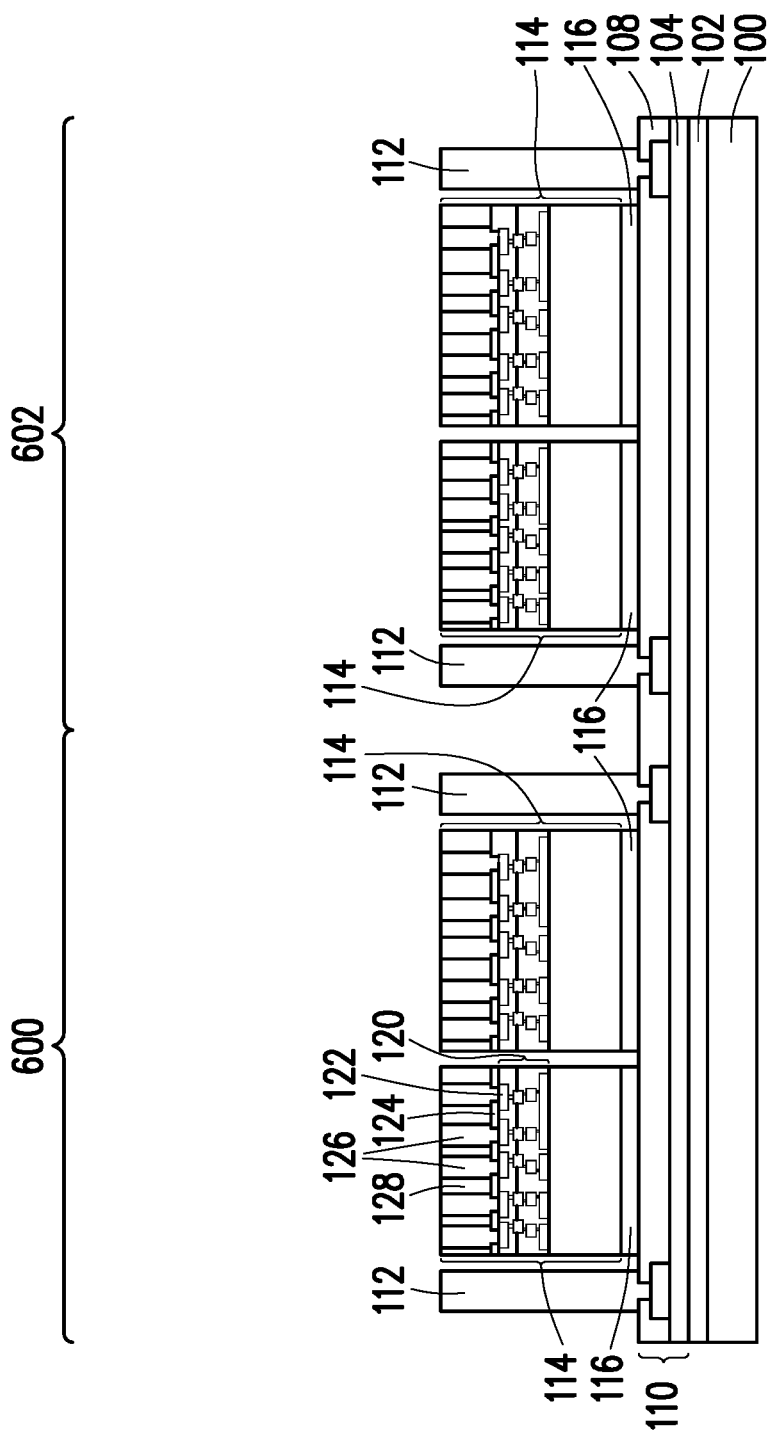

In FIG. 4, integrated circuit dies 114 are adhered to the dielectric layer 108 by an adhesive 116. As illustrated in FIG. 4, two integrated circuit dies 114 are adhered in each of the first package region 600 and the second package region 602, and in other embodiments, more or less integrated circuit dies 114 may be adhered in each region. The integrated circuit dies 114 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the integrated circuit dies 114 may be different sizes (e.g., different heights and/or surface areas), and in other embodiments, the integrated circuit dies 114 may be the same size (e.g., same heights and/or surface areas).

Before being adhered to the dielectric layer 108, the integrated circuit dies 114 may be processed according to applicable manufacturing processes to form integrated circuits in the integrated circuit dies 114. For example, the integrated circuit dies 114 each include a semiconductor substrate 118, such as silicon, doped or undoped, or an active layer of a semiconductor-on-insulator (SOI) substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 118 and may be interconnected by interconnect structures 120 formed by, for example, metallization patterns in one or more dielectric layers on the semiconductor substrate 118 to form an integrated circuit.

The integrated circuit dies 114 further comprise pads 122, such as aluminum pads, to which external connections are made. The pads 122 are on what may be referred to as respective active sides of the integrated circuit dies 114. Passivation films 124 are on the integrated circuit dies 114 and on portions of the pads 122. Openings are through the passivation films 124 to the pads 122. Die connectors 126, such as conductive pillars (for example, comprising a metal such as copper), are in the openings through passivation films 124 and are mechanically and electrically coupled to the respective pads 122. The die connectors 126 may be formed by, for example, plating, or the like. The die connectors 126 electrically couple the respective integrated circuits of the integrate circuit dies 114.

A dielectric material 128 is on the active sides of the integrated circuit dies 114, such as on the passivation films 124 and the die connectors 126. The dielectric material 128 laterally encapsulates the die connectors 126, and the dielectric material 128 is laterally coterminous with the respective integrated circuit dies 114. The dielectric material 128 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

Adhesive 116 is on back-sides of the integrated circuit dies 114 and adheres the integrated circuit dies 114 to the back-side redistribution structure 110, such as the dielectric layer 108 in the illustration. The adhesive 116 may be any suitable adhesive, epoxy, die attach film (DAF), or the like. The adhesive 116 may be applied to a back-side of the integrated circuit dies 114, such as to a back-side of the respective semiconductor wafer or may be applied over the surface of the carrier substrate 100. The integrated circuit dies 114 may be singulated, such as by sawing or dicing, and adhered to the dielectric layer 108 by the adhesive 116 using, for example, a pick-and-place tool.

Figure 5:
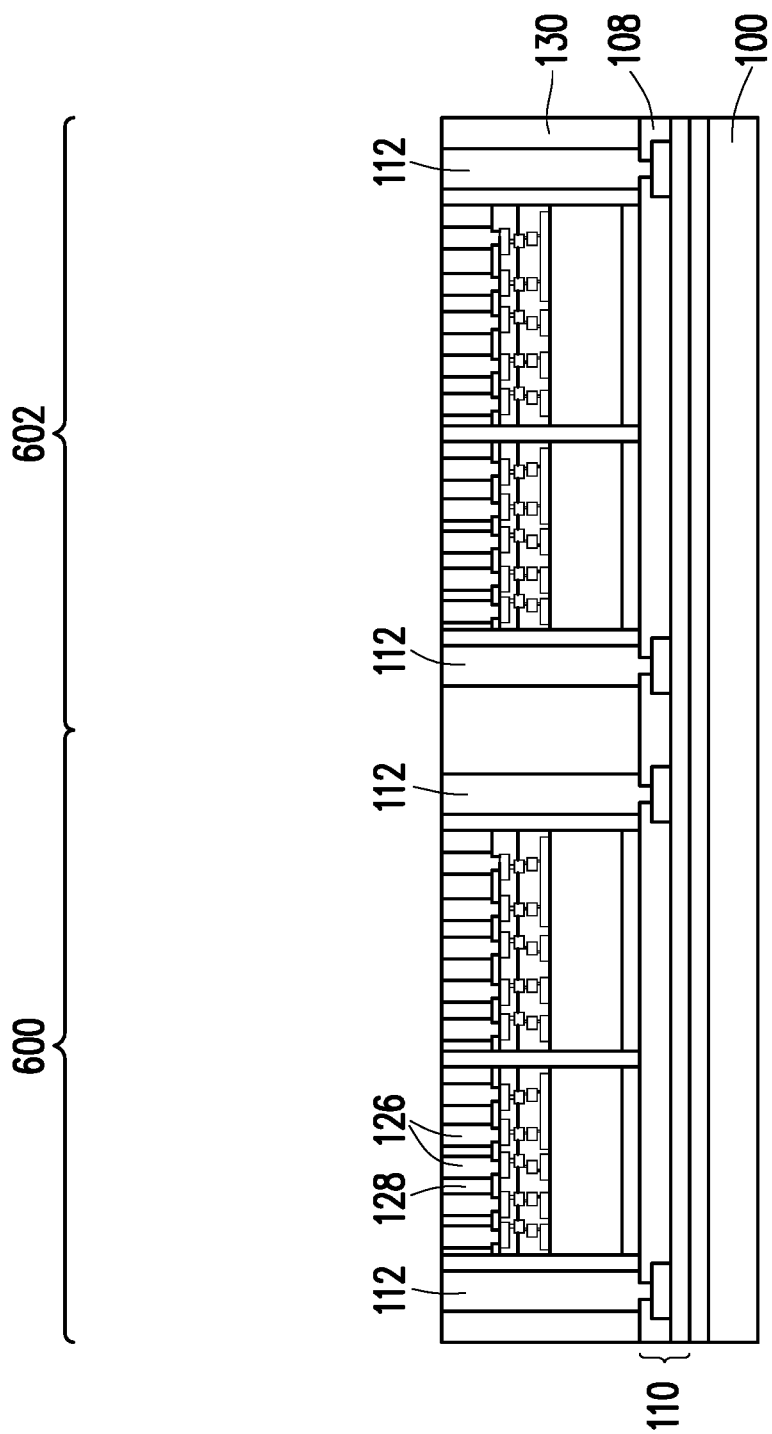

In FIG. 5, an encapsulant 130 is formed on the various components. The encapsulant 130 may be a molding compound, epoxy, or the like, and may be applied by compression molding, transfer molding, or the like. After curing, the encapsulant 130 can undergo a grinding process to expose the through vias 112 and die connectors 126. Top surfaces of the through vias 112, die connectors 126, and encapsulant 130 are coplanar after the grinding process. In some embodiments, the grinding may be omitted, for example, if through vias 112 and die connectors 126 are already exposed.

In FIGS. 6 through 16, a front-side redistribution structure 160 is formed. As will be illustrated in FIG. 16, the front-side redistribution structure 160 includes dielectric layers 132, 140, 148, and 156 and metallization patterns 138, 146, and 154.

Figure 6:
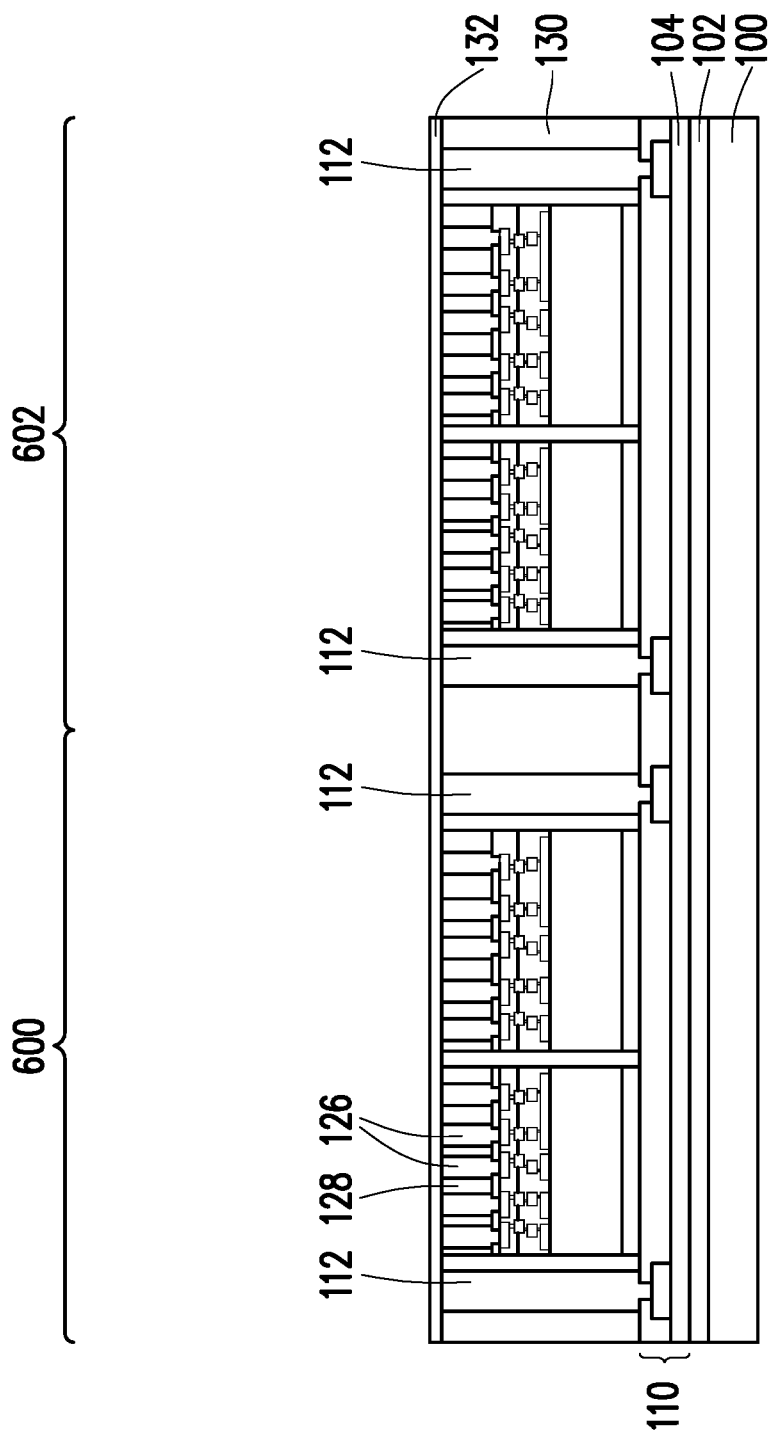

In FIG. 6, the dielectric layer 132 is deposited on the encapsulant 130, through vias 112, and die connectors 126. In some embodiments, the dielectric layer 132 is formed of a polymer, which may be a photo-sensitive material such as PBO, polyimide, BCB, or the like, that may be patterned using a lithography mask. In other embodiments, the dielectric layer 132 is formed of a nitride such as silicon nitride; an oxide such as silicon oxide, PSG, BSG, BPSG; or the like. The dielectric layer 132 may be formed by spin coating, lamination, CVD, the like, or a combination thereof.

Figure 7:
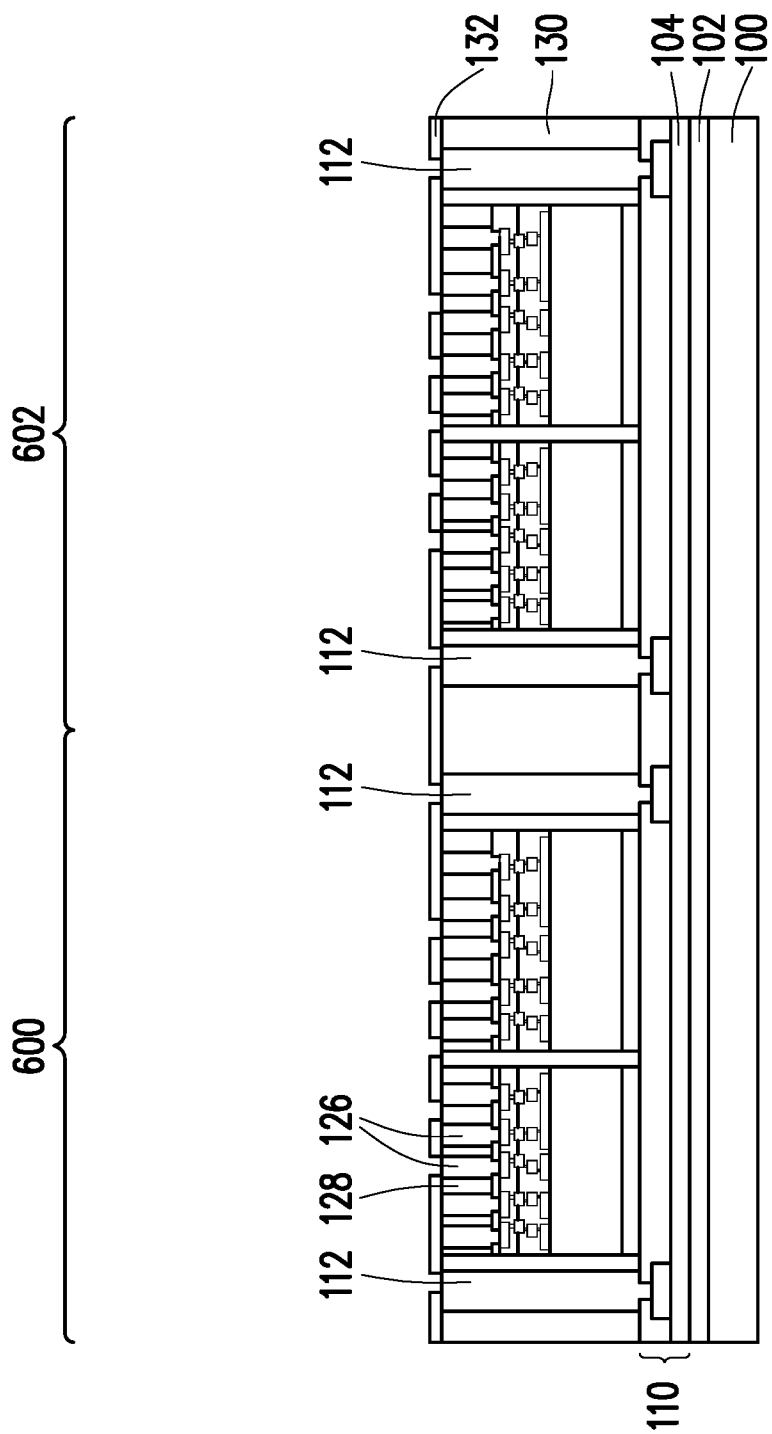

In FIG. 7, the dielectric layer 132 is then patterned. The patterning forms openings to expose portions of the through vias 112 and the die connectors 126. The patterning may be by an acceptable process, such as by exposing the dielectric layer 132 to light when the dielectric layer 132 is a photo-sensitive material or by etching using, for example, an anisotropic etch. If the dielectric layer 132 is a photo-sensitive material, the dielectric layer 132 can be developed after the exposure.

Figure 8:
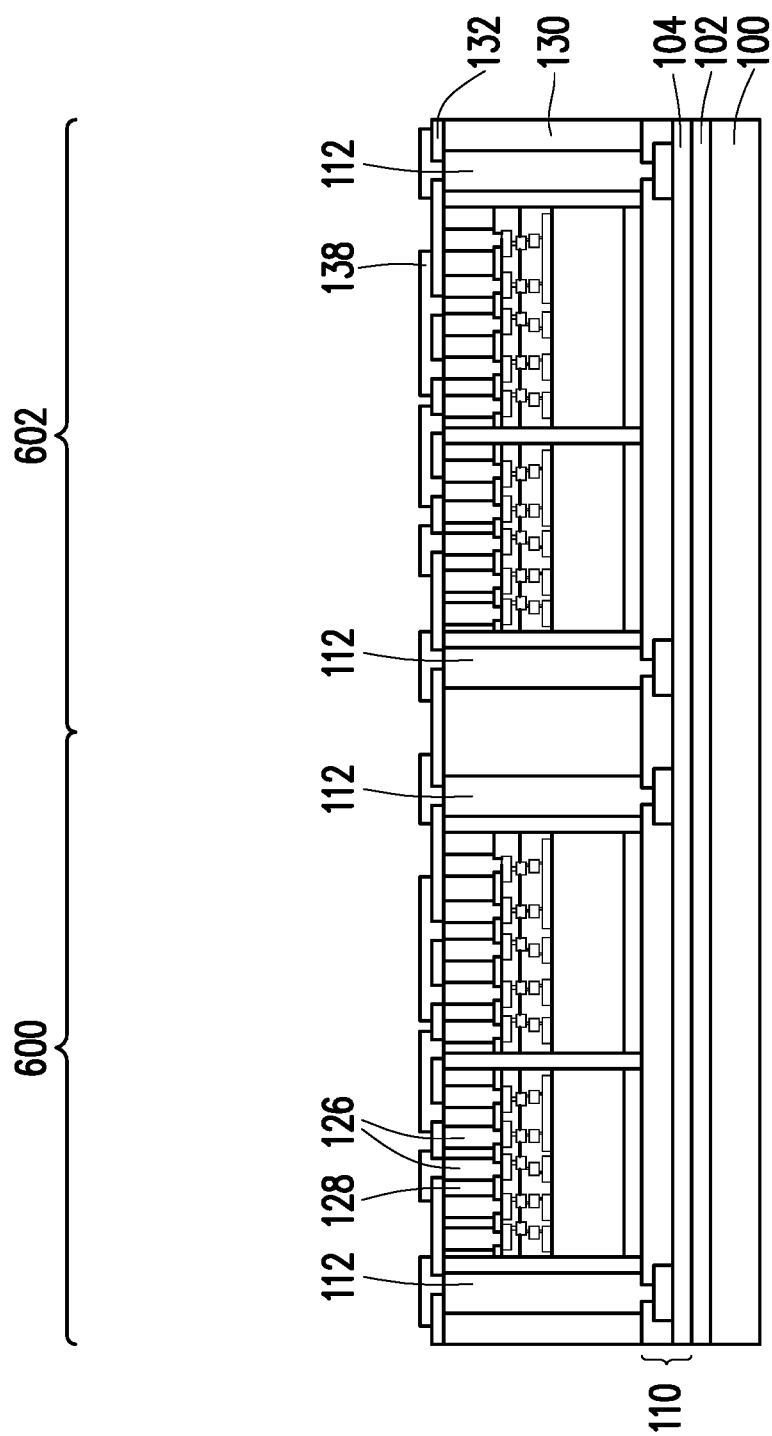

In FIG. 8, metallization pattern 138 with vias is formed on the dielectric layer 132. As an example to form metallization pattern 138, a seed layer (not shown) is formed over the dielectric layer 132 and in openings through the dielectric layer 132. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 138. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 138 and vias. The vias are formed in openings through the dielectric layer 132 to, e.g., the through vias 112 and/or the die connectors 126.

Figure 9:
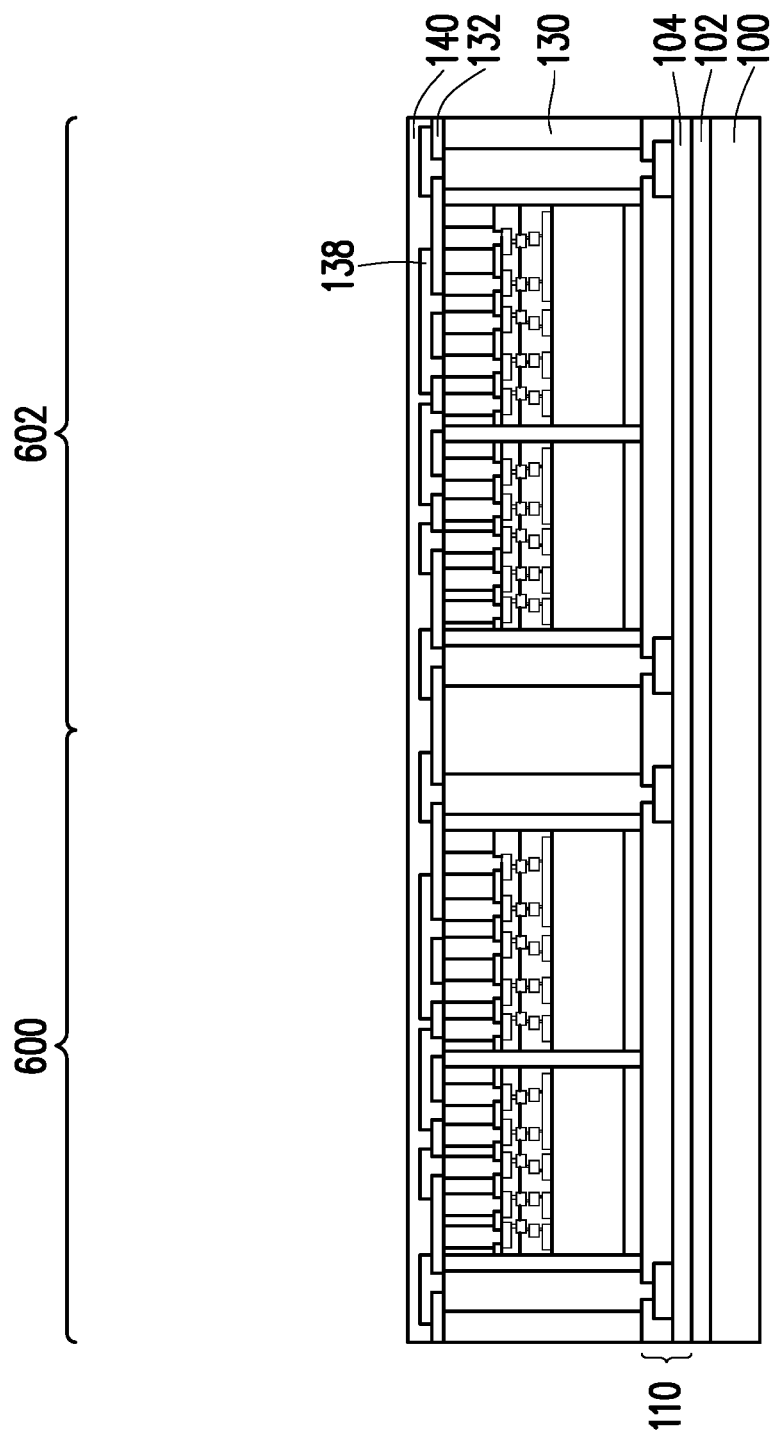

In FIG. 9, the dielectric layer 140 is deposited on the metallization pattern 138 and the dielectric layer 132. In some embodiments, the dielectric layer 140 is formed of a polymer, which may be a photo-sensitive material such as PBO, polyimide, BCB, or the like, that may be patterned using a lithography mask. In other embodiments, the dielectric layer 140 is formed of a nitride such as silicon nitride; an oxide such as silicon oxide, PSG, BSG, BPSG; or the like. The dielectric layer 140 may be formed by spin coating, lamination, CVD, the like, or a combination thereof.

Figure 10:
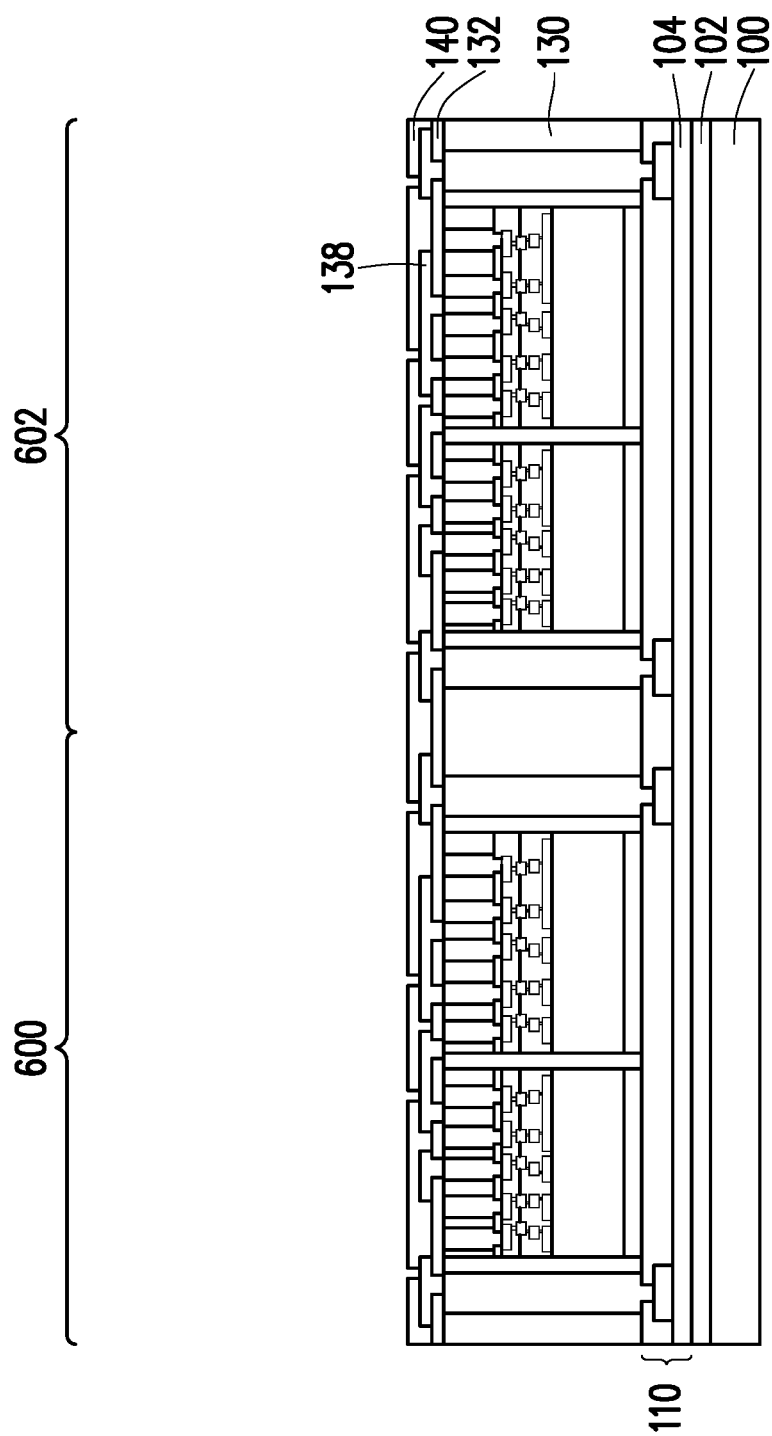

In FIG. 10, the dielectric layer 140 is then patterned. The patterning forms openings to expose portions of the metallization pattern 138. The patterning may be by an acceptable process, such as by exposing the dielectric layer 140 to light when the dielectric layer is a photo-sensitive material or by etching using, for example, an anisotropic etch. If the dielectric layer 140 is a photo-sensitive material, the dielectric layer 140 can be developed after the exposure.

Figure 11:
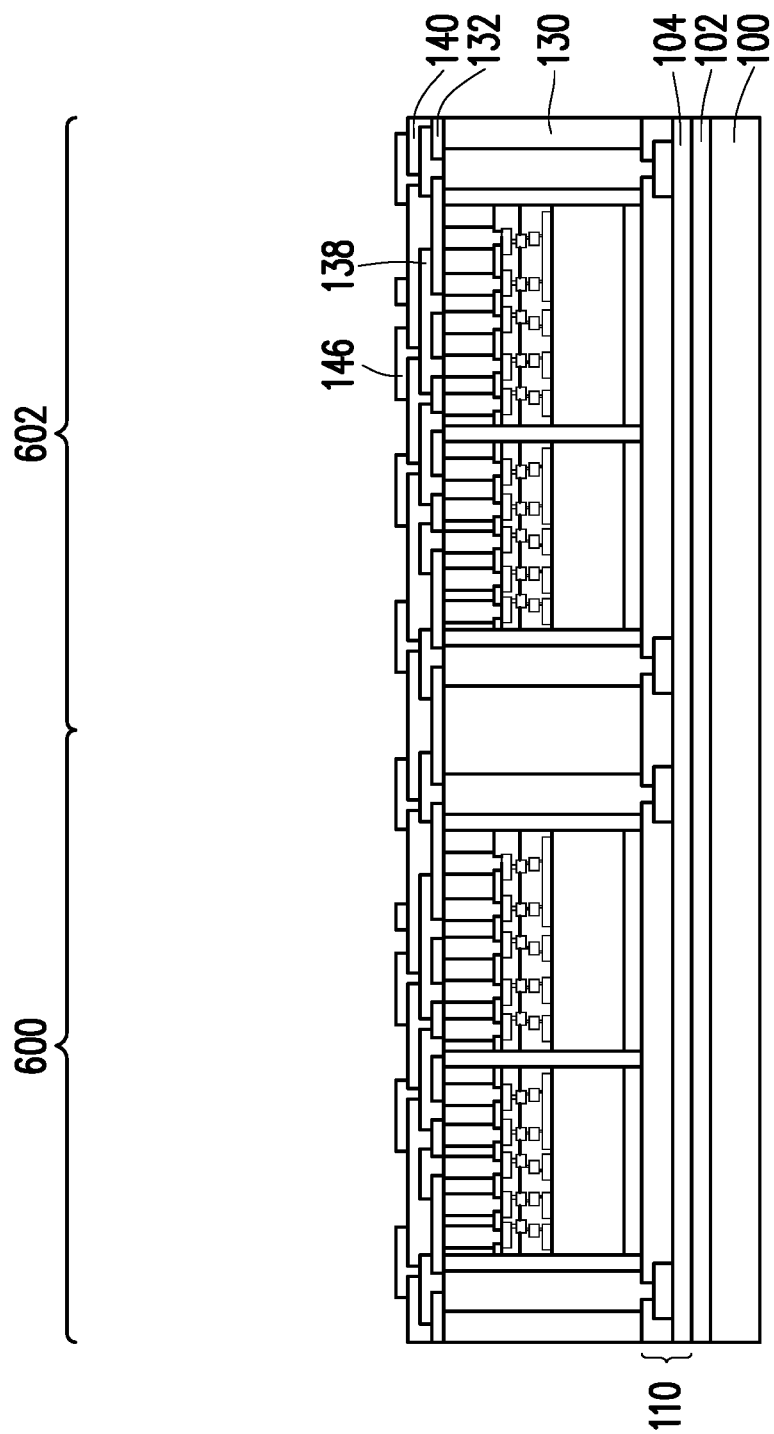

In FIG. 11, metallization pattern 146 with vias is formed on the dielectric layer 140. As an example to form metallization pattern 146, a seed layer (not shown) is formed over the dielectric layer 140 and in openings through the dielectric layer 140. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 146. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 146 and vias. The vias are formed in openings through the dielectric layer 140 to, e.g., portions of the metallization pattern 138.

Figure 12:
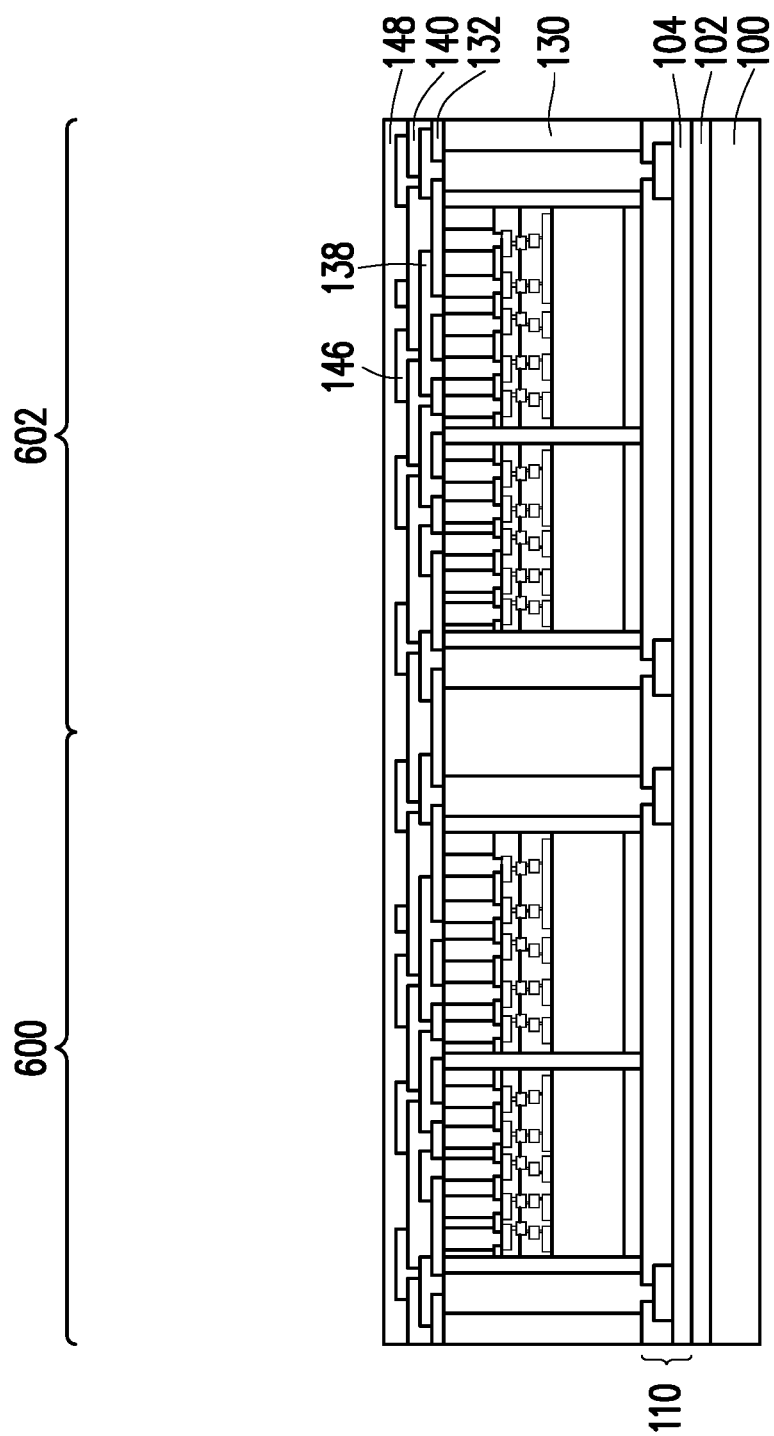

In FIG. 12, the dielectric layer 148 is deposited on the metallization pattern 146 and the dielectric layer 140. In some embodiments, the dielectric layer 148 is formed of a polymer, which may be a photo-sensitive material such as PBO, polyimide, BCB, or the like, that may be patterned using a lithography mask. In other embodiments, the dielectric layer 148 is formed of a nitride such as silicon nitride; an oxide such as silicon oxide, PSG, BSG, BPSG; or the like. The dielectric layer 148 may be formed by spin coating, lamination, CVD, the like, or a combination thereof.

Figure 13:
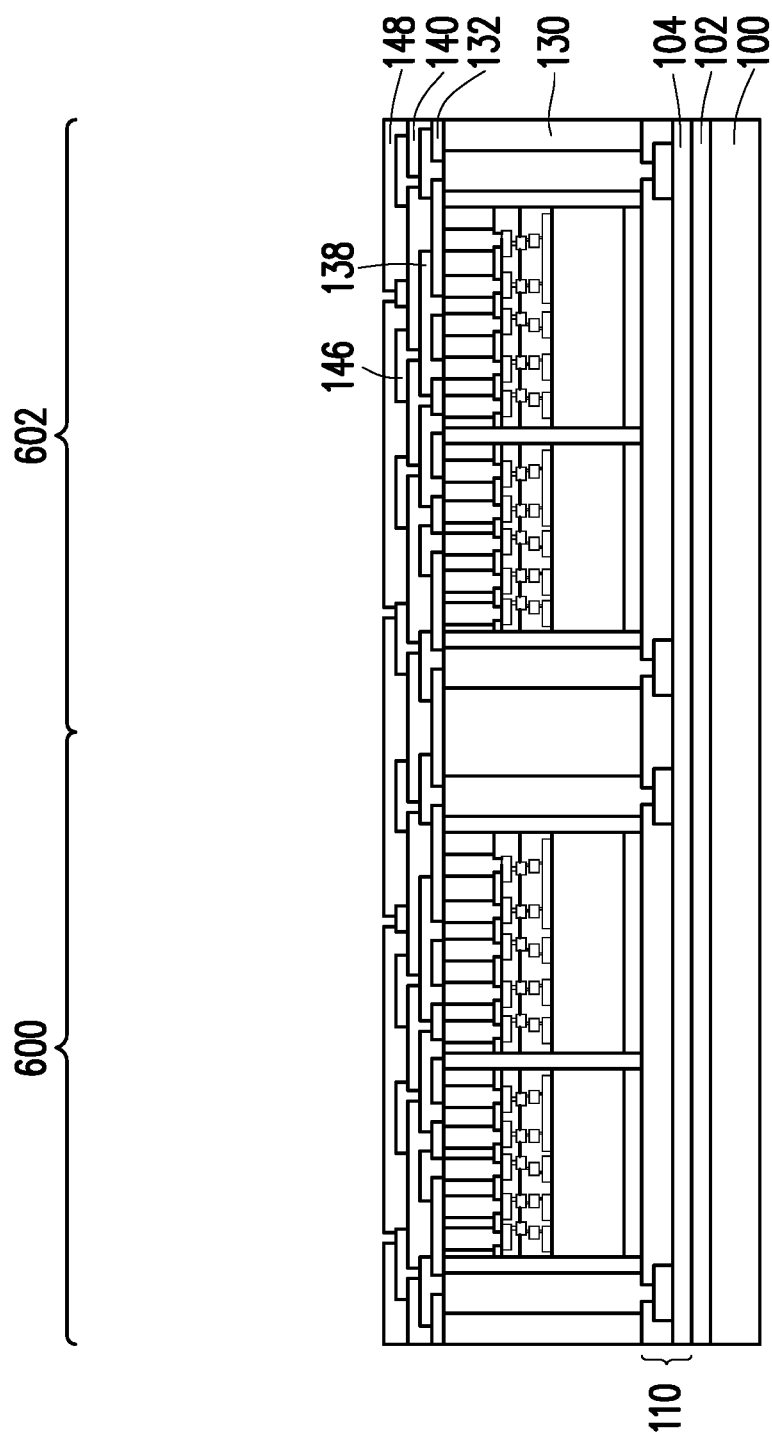

In FIG. 13, the dielectric layer 148 is then patterned. The patterning forms openings to expose portions of the metallization pattern 146. The patterning may be by an acceptable process, such as by exposing the dielectric layer 148 to light when the dielectric layer is a photo-sensitive material or by etching using, for example, an anisotropic etch. If the dielectric layer 148 is a photo-sensitive material, the dielectric layer 148 can be developed after the exposure.

Figure 14:
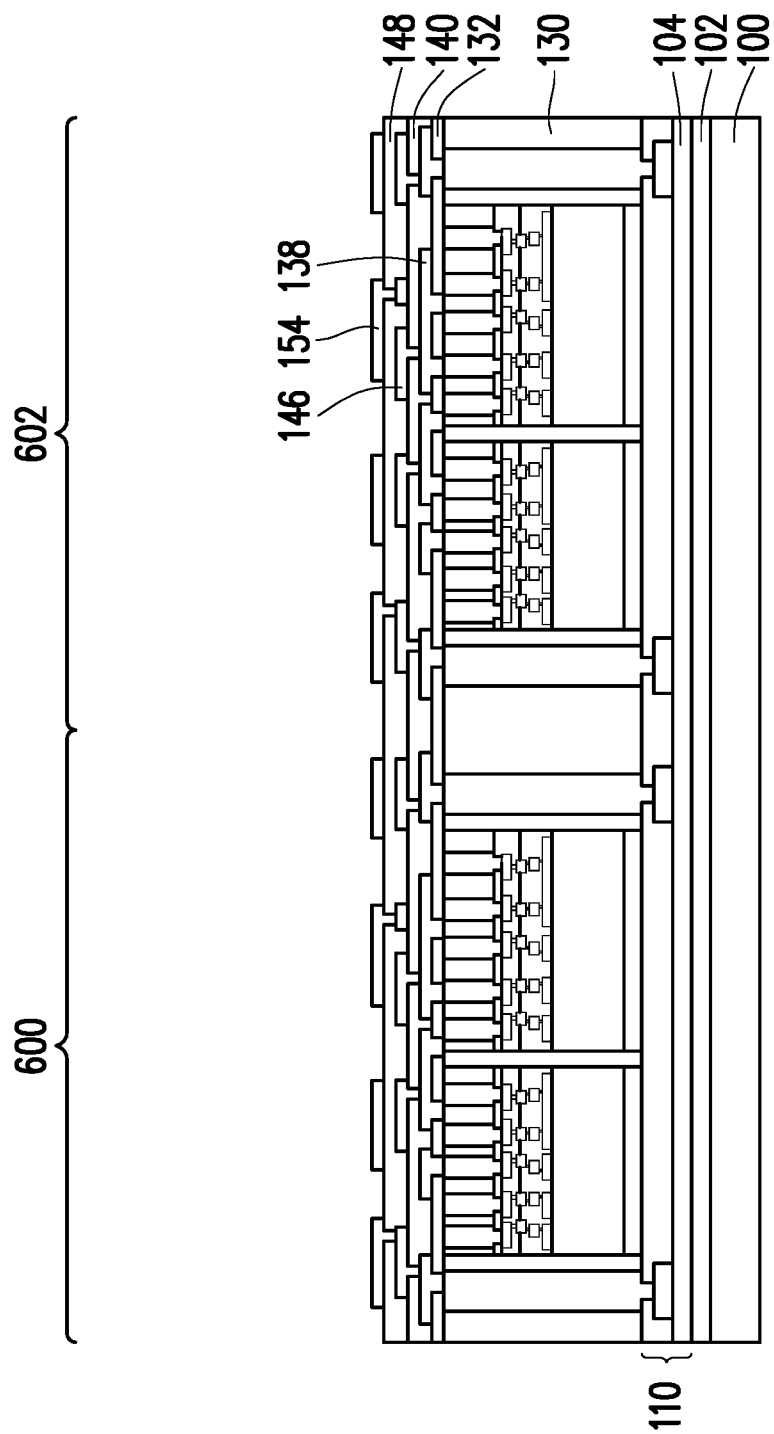

In FIG. 14, metallization pattern 154 with vias is formed on the dielectric layer 148. As an example to form metallization pattern 154, a seed layer (not shown) is formed over the dielectric layer 148 and in openings through the dielectric layer 148. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the metallization pattern 154. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the metallization pattern 154 and vias. The vias are formed in openings through the dielectric layer 148 to, e.g., portions of the metallization pattern 146.

Figure 15:
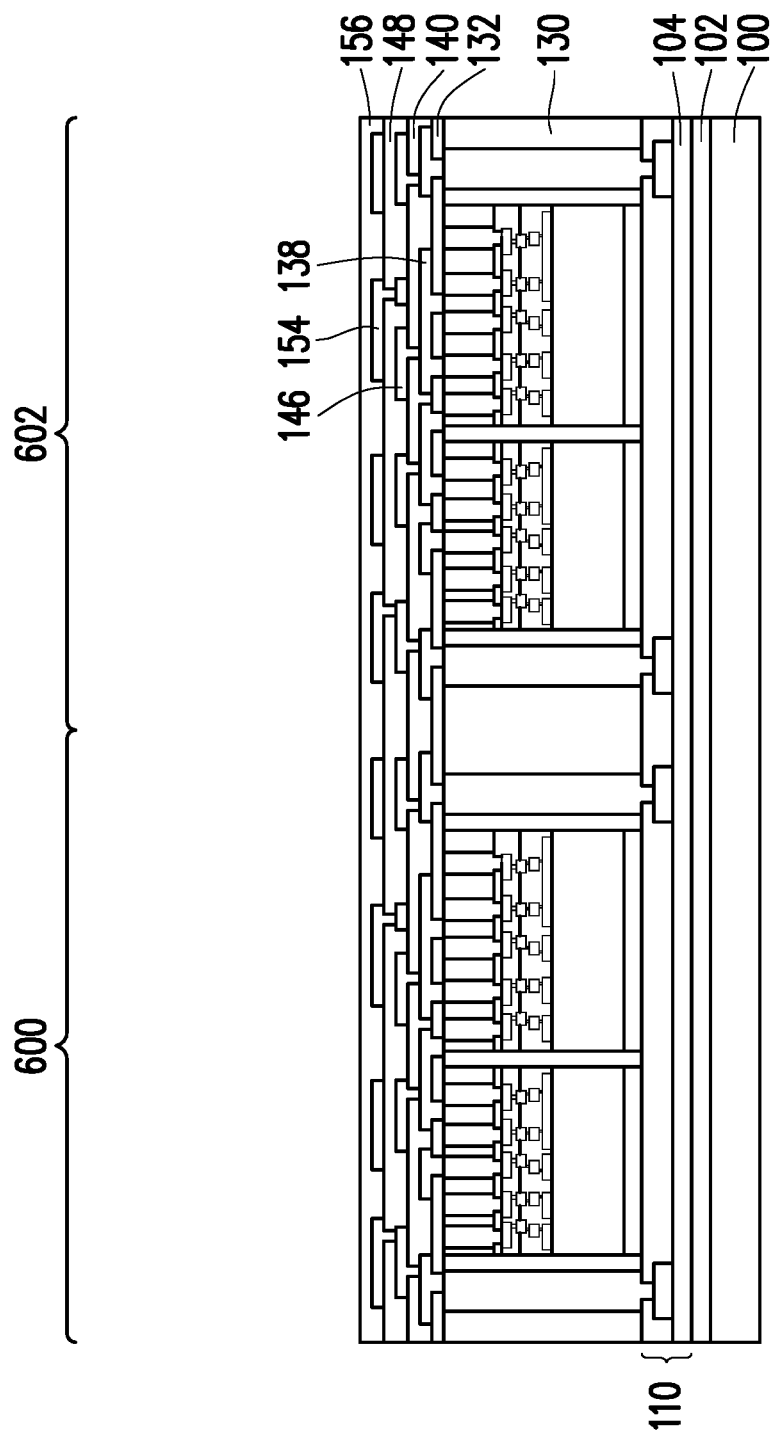

In FIG. 15, the dielectric layer 156 is deposited on the metallization pattern 154 and the dielectric layer 148. In some embodiments, the dielectric layer 156 is formed of a polymer, which may be a photo-sensitive material such as PBO, polyimide, BCB, or the like, that may be patterned using a lithography mask. In other embodiments, the dielectric layer 156 is formed of a nitride such as silicon nitride; an oxide such as silicon oxide, PSG, BSG, BPSG; or the like. The dielectric layer 156 may be formed by spin coating, lamination, CVD, the like, or a combination thereof.

Figure 16:
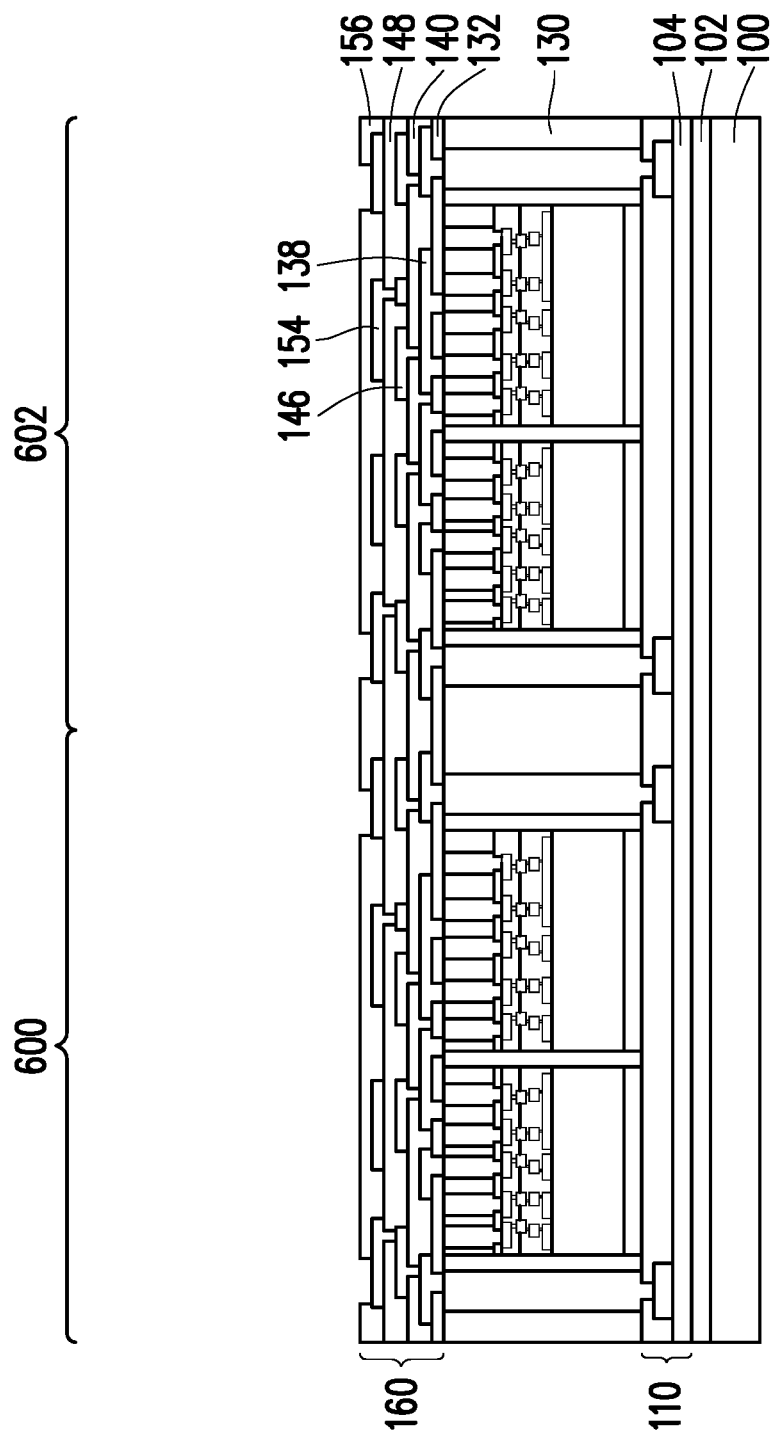

In FIG. 16, the dielectric layer 156 is then patterned. The patterning forms openings to expose portions of the metallization pattern 154 for the subsequent formation of pads 162. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

The front-side redistribution structure 160 is shown as an example. More or fewer dielectric layers and metallization patterns may be formed in the front-side redistribution structure 160. If fewer dielectric layers and metallization patterns are to be formed, steps and process discussed above may be omitted. If more dielectric layers and metallization patterns are to be formed, steps and processes discussed above may be repeated. One having ordinary skill in the art will readily understand which steps and processes would be omitted or repeated.

Figure 17:
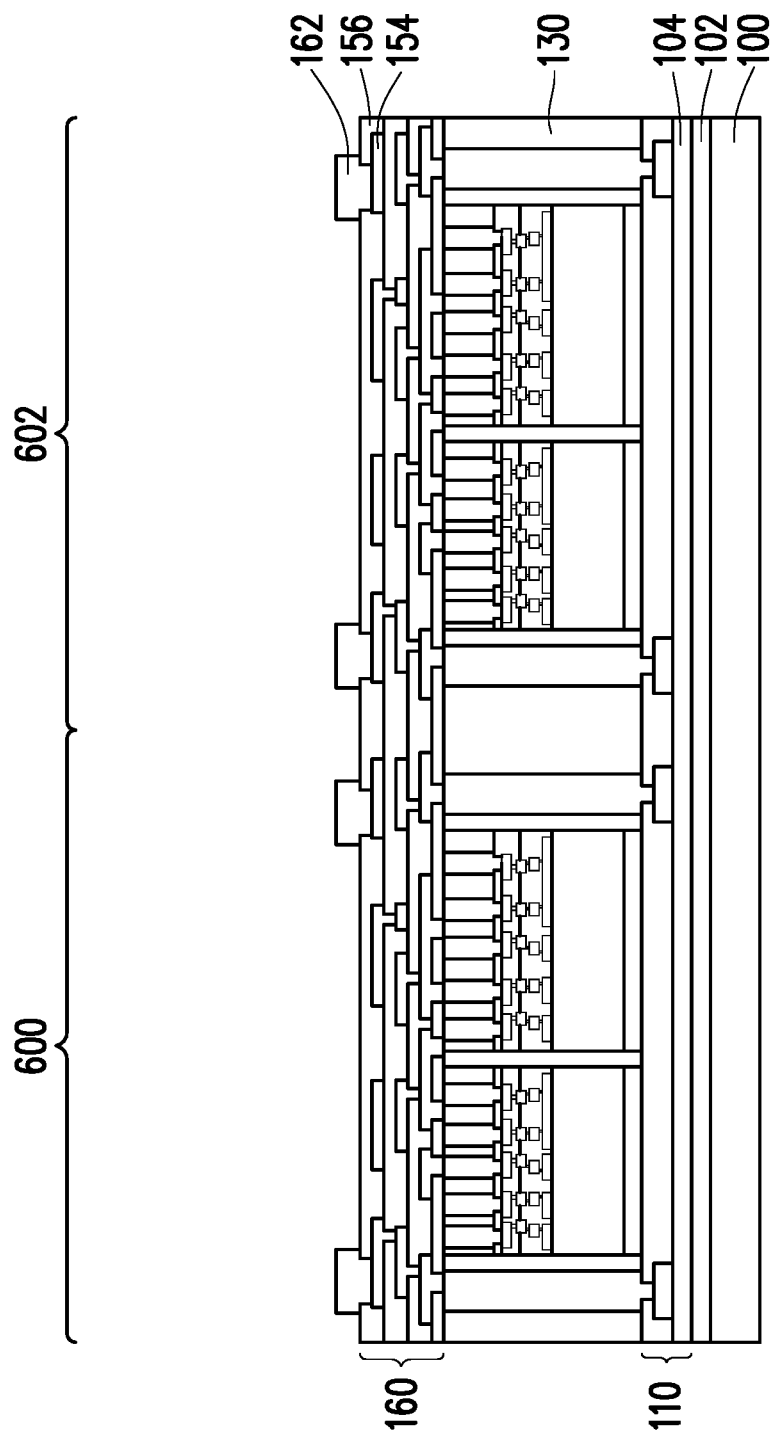

In FIG. 17, pads 162 are formed on an exterior side of the front-side redistribution structure 160. The pads 162 are used to couple to conductive connectors 166 (see FIG. 20) and may be referred to as under bump metallurgies (UBMs) 162. In the illustrated embodiment, the pads 162 are formed through openings through the dielectric layer 156 to the metallization pattern 154. As an example to form the pads 162, a seed layer (not shown) is formed over the dielectric layer 156. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, PVD or the like. A photo resist is then formed and patterned on the seed layer. The photo resist may be formed by spin coating or the like and may be exposed to light for patterning. The pattern of the photo resist corresponds to the pads 162. The patterning forms openings through the photo resist to expose the seed layer. A conductive material is formed in the openings of the photo resist and on the exposed portions of the seed layer. The conductive material may be formed by plating, such as electroplating or electroless plating, or the like. The conductive material may comprise a metal, like copper, titanium, tungsten, aluminum, or the like. Then, the photo resist and portions of the seed layer on which the conductive material is not formed are removed. The photo resist may be removed by an acceptable ashing or stripping process, such as using an oxygen plasma or the like. Once the photo resist is removed, exposed portions of the seed layer are removed, such as by using an acceptable etching process, such as by wet or dry etching. The remaining portions of the seed layer and conductive material form the pads 162. In the embodiment, where the pads 162 are formed differently, more photo resist and patterning steps may be utilized.

Figure 18:
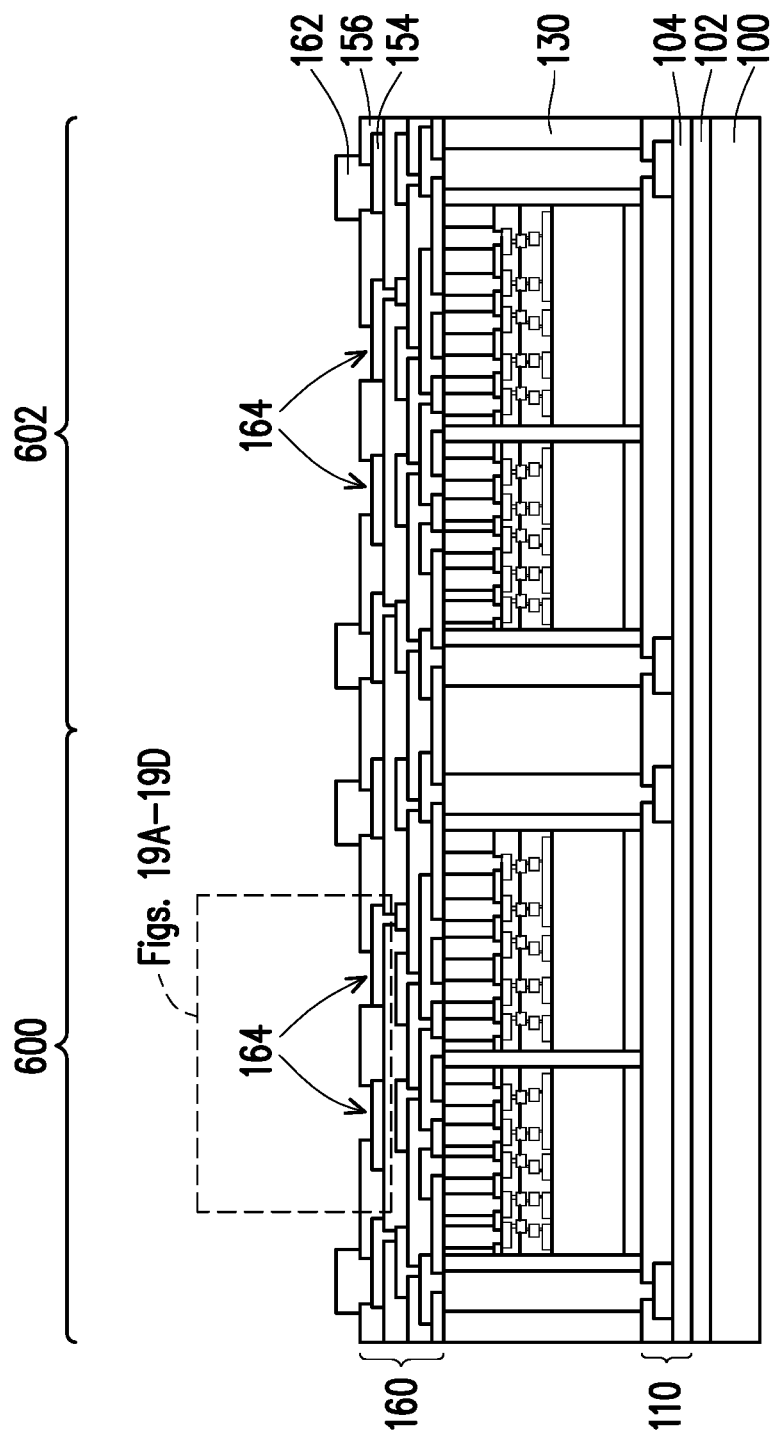

In FIG. 18, the dielectric layer 156 is further patterned. In some embodiments, the openings 164 for the IPD components 170 are formed at a same time as the openings for the pads 162. This patterning forms openings 164 to expose portions of the metallization pattern 154 for the subsequent bonding of the IPDs 170. The patterning may be by an acceptable process, such as by exposing the dielectric layer 156 to light when the dielectric layer is a photo-sensitive material or by etching using, for example, an anisotropic etch. If the dielectric layer 156 is a photo-sensitive material, the dielectric layer 156 can be developed after the exposure.

FIGS. 19A through 19D illustrate cross-sectional views of the openings 164 in accordance with some embodiments. FIG. 19A illustrates an opening 164 though the dielectric layer 156 that has a width that is less than the width of the metallization pattern 154. FIG. 19B illustrates an opening 164 though the dielectric layer 156 that has a width that is greater than the width of the metallization pattern 154.

FIGS. 19C and 19D illustrate openings 164 with tapered sidewalls 164A. In FIG. 19C, the opening 164 is formed with a photolithography process and results in the tapered sidewalls 164A being smooth. FIG. 19D, the opening 164 is formed with a laser drilling process and results in the tapered sidewalls 164A being slightly rough. The rough sidewalls 164A of the opening 164 can result in greater adhesion and bonding strength of the IPDs 170.

Figure 20A:
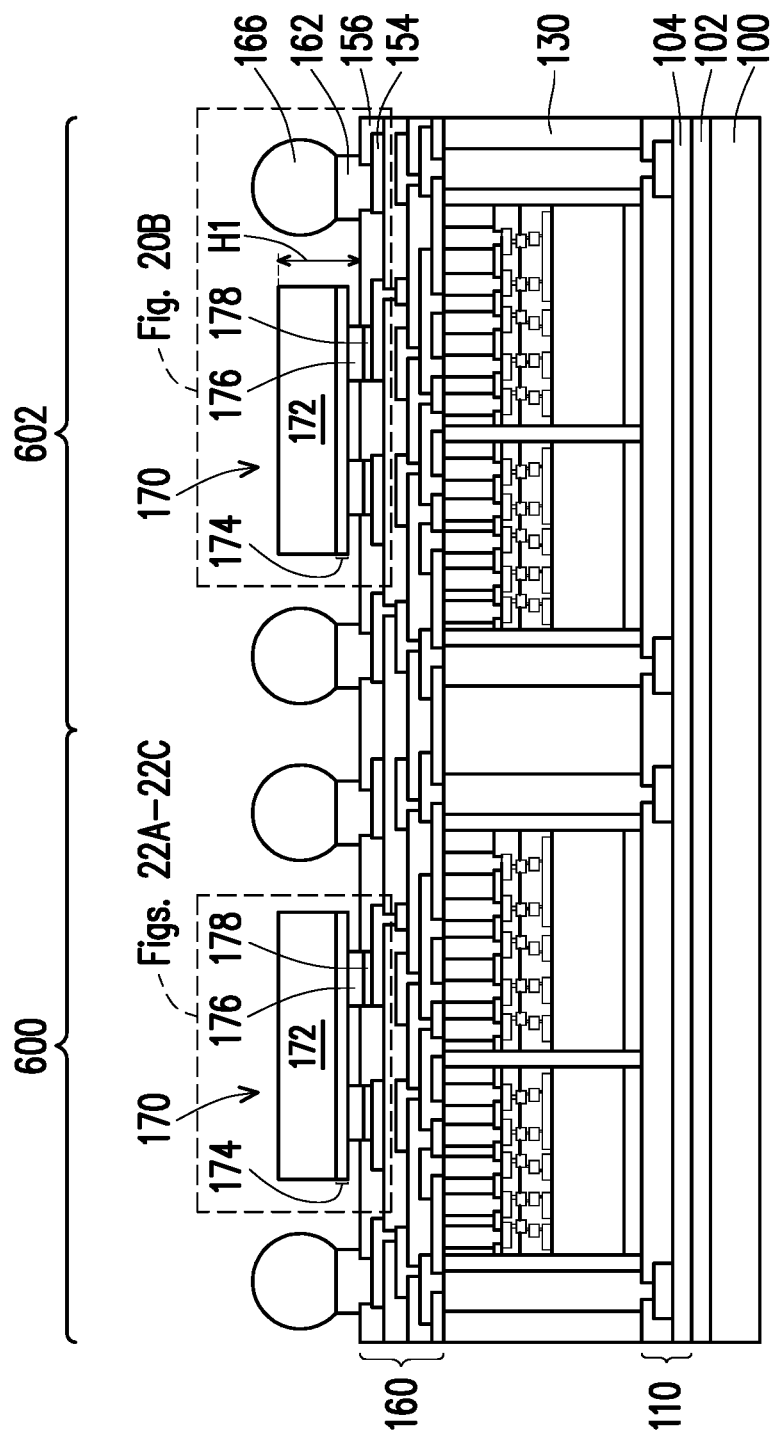

In FIG. 20A, conductive connectors 166 are formed on the UBMs 162 and the IPD components 170 are bonded to the metallization pattern 154 through the openings 164. The IPD components may be bonded to the metallization pattern 154 using micro bumps with a solder layer. In some embodiments the conductive connectors 166 may be mounted on the pads 162 before the IPD components are bonded and mounted to the redistribution structure 160. In some embodiments the conductive connectors 166 may be mounted on the pads 162 after the IPD components are bonded and mounted to the redistribution structure 160.

The IPD components 170 may be bonded to the metallization patterns of the front-side redistribution structure 160 without any UBM or pad. By removing the UBM or pad under the IPD component 170 joint area, the total height H1 of the IPD component 170 is reduced. In some embodiments, the IPD component 170 height H1 from the top surface of the dielectric layer 156 can be reduced by more than 20 μm as compared to an IPD component that is bonded to a UBM or pad. Hence, the likelihood of the backside surface of the IPD component 170 touching the substrate 400 (see FIG. 26) is reduced and the process window is enlarged for package structures include an IPD component 170.

Before being bonded to the redistribution structure 160, the IPD components 170 may be processed according to applicable manufacturing processes to form passive devices in the IPD components 170. For example, the IPD components each comprise one or more passive devices in the main structure 172 of the IPD components 170. The main structure 172 could include a substrate and/or encapsulant. In the embodiments including a substrate, the substrate could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The passive devices may include a capacitor, resistor, inductor, the like, or a combination thereof. The passive devices may be formed in and/or on the semiconductor substrate and/or within the encapsulant and may be interconnected by interconnect structures 174 formed by, for example, metallization patterns in one or more dielectric layers on the main structure 172 to form an integrated passive device 170.

The IPD components 170 further comprise micro bumps 176 formed and coupled to the interconnect 174, to which external connections are made. The micro bumps 176 have a solder layer or bump 178 formed on an end of the micro bump 176 that forms a solder joint between the front-side redistribution structure 160 and the IPD components 170. In contrast to conventional solder balls such as those used in a ball grid array (BGA) connector (see conductive connectors 166), which may have a diameter ranging from, e.g., about 150 μm to about 300 μm, micro bumps have much smaller diameters ranging from, e.g., about 10 μm to about 40 μm. The micro bumps may, in some embodiments, have a pitch of about 40 μm or greater.

In some embodiments, the IPD components 170 cannot be forced onto the front-side redistribution structure 160 during the bonding process. In these embodiments, the bonding of the IPD components 170 may begin by positioning the IPD component 170 at the level of the conductive connectors 166 with, e.g., a pick-and-place tool. Next, the pick-and-place tool drops the IPD component 170 onto the openings 164 and the exposed metallization pattern 154 of the front-side redistribution structure 160. During a subsequent bonding process, the micro bumps are bonded to metallization pattern 154 by, e.g., a reflow process, and as a result of the bonding process, solder joints are formed which electrically and mechanically connect the micro bumps 176 of the IPD component 170 with the metallization pattern 154 of the package. The small size of micro bumps 176 allows fine pitches between micro bump 176 and enables high-density connections.

Figure 20B:
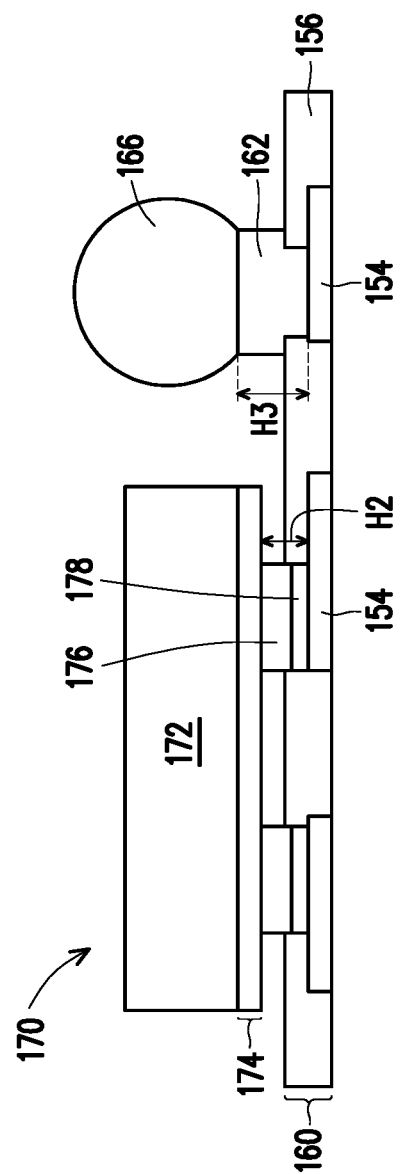

FIG. 20B illustrates a detailed view of a portion of the redistribution structure 160, one of the IPD components 70, one of the UBMs 162, and one of the conductive connectors 160. The micro bumps 176 and the solder layer 178 have a height H2 as measured from a surface of the metallization pattern 154. The UBM 162 has a height H3 as measured from the surface of the metallization pattern 154, with the height H3 being greater than the height H2. In some embodiments, the difference between H2 and H3 can be more than 20 µm.

Referring back to FIG. 20A, the conductive connectors 166 may be BGA connectors, solder balls, metal pillars, controlled collapse chip connection (C4) bumps, micro bumps, electroless nickel-electroless palladium-immersion gold technique (ENEPIG) formed bumps, or the like. The conductive connectors 166 may include a conductive material such as solder, copper, aluminum, gold, nickel, silver, palladium, tin, the like, or a combination thereof. In some embodiments, the conductive connectors 166 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 166 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 166. The metal cap layer may include nickel, tin, tin-lead, gold, silver, palladium, indium, nickel-palladium-gold, nickel-gold, the like, or a combination thereof and may be formed by a plating process.

Figure 21A:
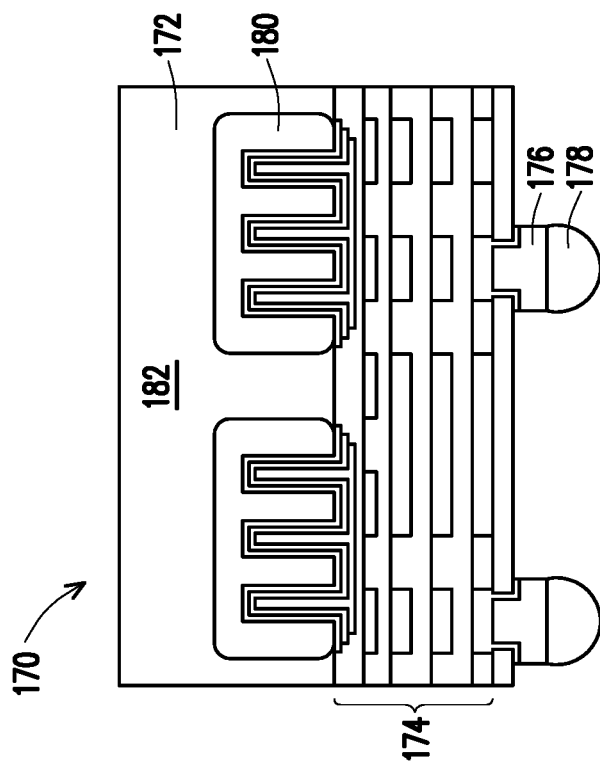
FIGS. 21A and 21B illustrate cross-sectional views of integrated passive devices in accordance with some embodiments.
Figure 21B:
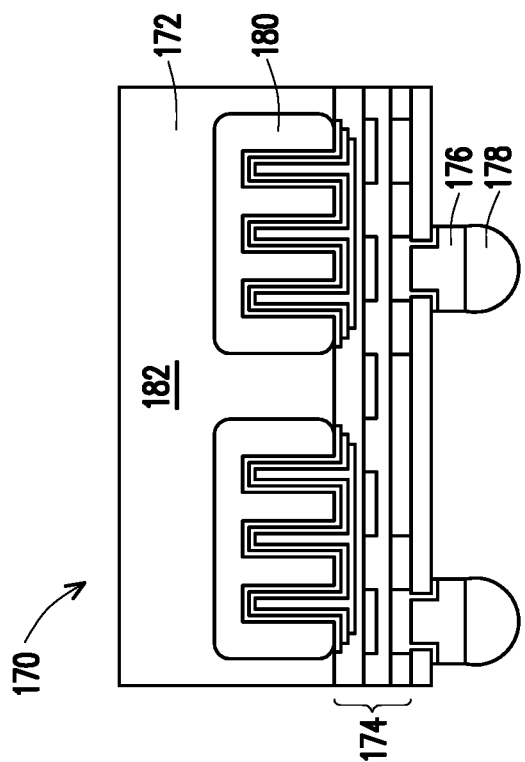

FIGS. 21A and 21B illustrate cross-sectional views of IPD components 170 in accordance with some embodiments. In FIG. 21A, the main structure 172 of the IPD component 170 includes passive devices 180 encapsulated with a molding material 182 or may be in a semiconductor substrate 182. The passive devices 180 may include a capacitor, resistor, inductor, the like, or a combination thereof. The molding material 182 may be a molding compound, a polymer, an epoxy, silicon oxide filler material, the like, or a combination thereof. In some embodiments, the substrate 182 could be a semiconductor substrate, such as silicon, doped or undoped, or an active layer of a SOI substrate. The semiconductor substrate may include other semiconductor material, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The interconnect structure 174 includes metallization patterns in one or more dielectric layers on the main structure 172 with the micro bump 176 and solder layer 178 coupled to the interconnect structure 174.

The IPD component 170 in FIG. 21B is similar to the IPD component 170 of FIG. 21A except that the interconnect structure 174 of FIG. 21B includes more metallization patterns and dielectric layers. This increase of metallization patterns and dielectric layers allows for more power and ground networks to be inserted within the IPD component 170 to reduce the parasitic capacitance and/or inductance of the IPD component 170, which can improve the performance of the IPD component 170. These improvements to the IPD components 170 can result in more stable voltages at higher frequencies for the IPD components 170.

Figure 22A:
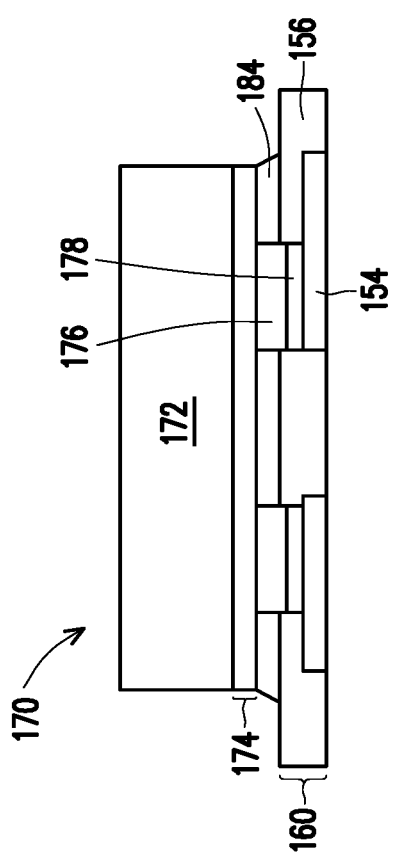
Figure 22B:
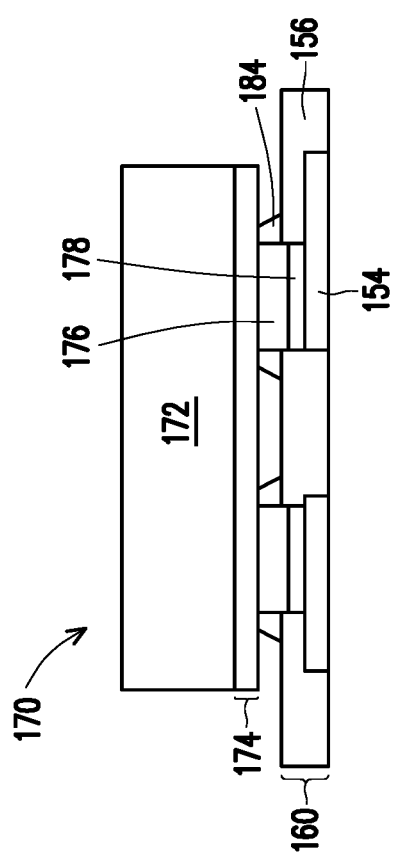

FIGS. 22A through 22C illustrate cross-sectional views of underfill schemes for the IPD components 170 in accordance with some embodiments. The underfill materials might be epoxy or polymer with filler or flux. FIG. 22A illustrates a full-fill underfill scheme where an underfill 184 completely fills the area between the IPD component 170 and front-side redistribution structure 160 and surrounds the micro bumps 176. The underfill 184 may be formed by a capillary flow process after the IPD component 170 is attached or may be formed by a suitable deposition or printing method before the IPD component 170 is attached.

FIG. 22B illustrates a partial-fill underfill scheme where the underfill 184 partially fills the area between the IPD component 170 and front-side redistribution structure 160 and partially surrounds the micro bumps 176. The underfill 184 may be formed by a capillary flow process after the IPD component 170 is attached or may be formed by a suitable deposition or printing method before the IPD component 170 is attached.

FIG. 22C illustrates a no-fill underfill scheme where no underfill fills the area between the IPD component 170 and front-side redistribution structure 160.

Figure 23:
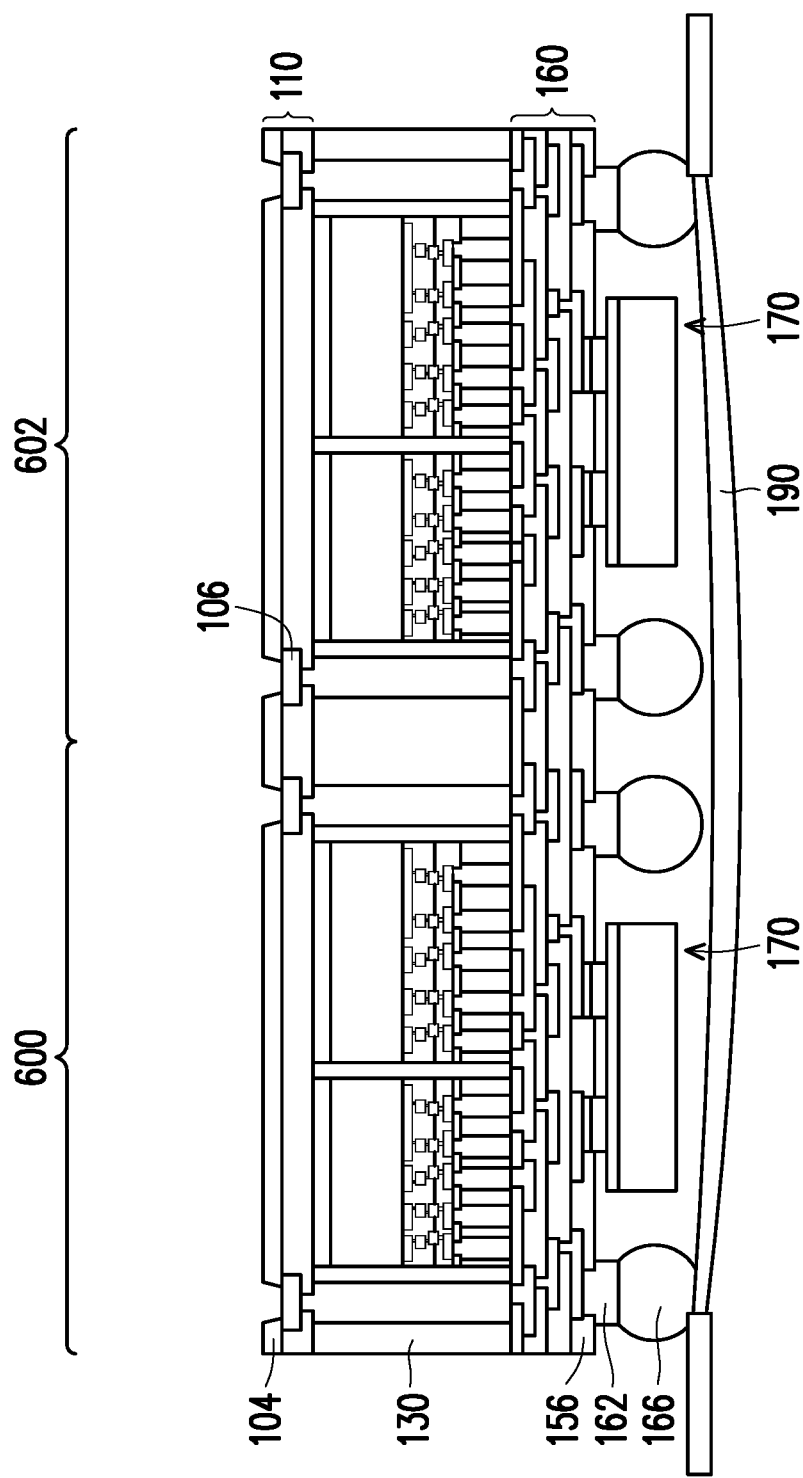

In FIG. 23, a carrier substrate de-bonding is performed to detach (de-bond) the carrier substrate 100 from the back-side redistribution structure, e.g., dielectric layer 104. In accordance with some embodiments, the de-bonding includes projecting a light such as a laser light or an UV light on the release layer 102 so that the release layer 102 decomposes under the heat of the light and the carrier substrate 100 can be removed. The structure is then flipped over and placed on a tape 190.

As further illustrated in FIG. 23, openings are formed through the dielectric layer 104 to expose portions of the metallization pattern 106. The openings may be formed, for example, using laser drilling, etching, or the like.

Figure 24:
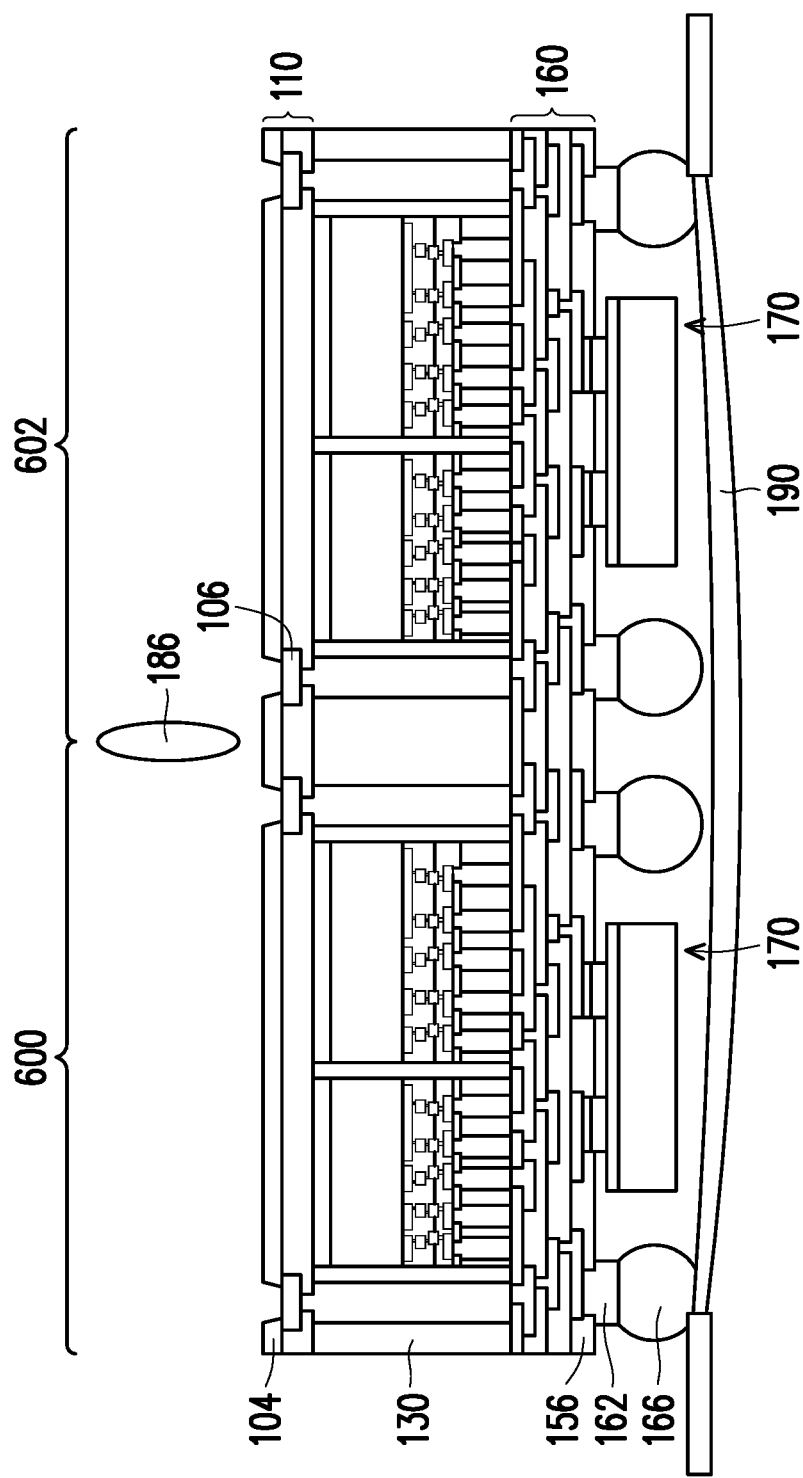

In FIG. 24, a singulation process is performed by singulating 186 along scribe line regions e.g., between adjacent regions 600 and 602. In some embodiments, the singulating 186 includes a sawing process, a laser process, or a combination thereof. The singulating 186 singulates the first package region 600 from the second package region 602.

Figure 25:
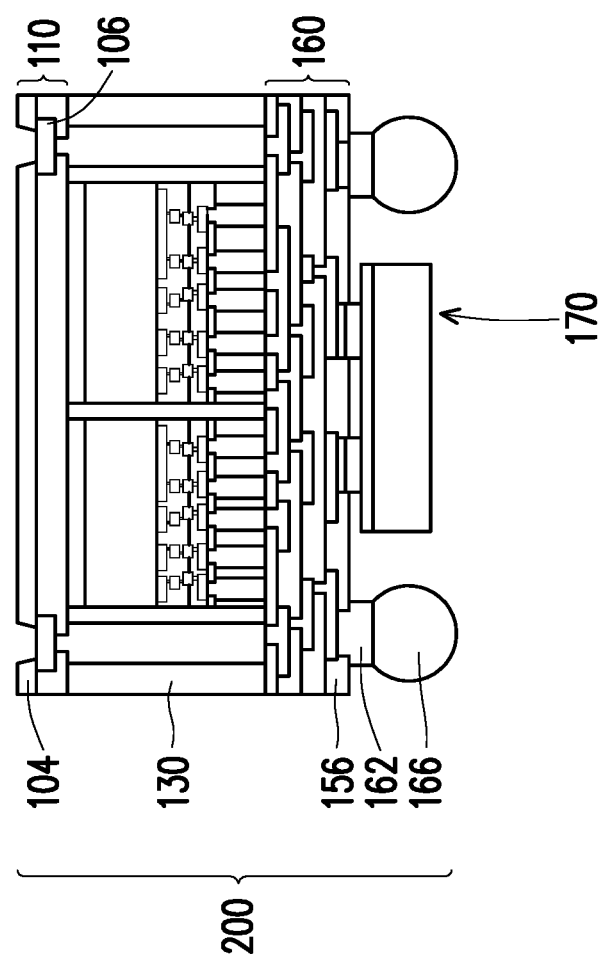

FIG. 25 illustrates a resulting, singulated package 200, which may be from one of the first package region 600 or the second package region 602. The package 200 may also be referred to as an integrated fan-out (InFO) package 200. In some embodiments, the singulation process is performed after the second package 300 is bonded to the InFO package 200.

Figure 26:
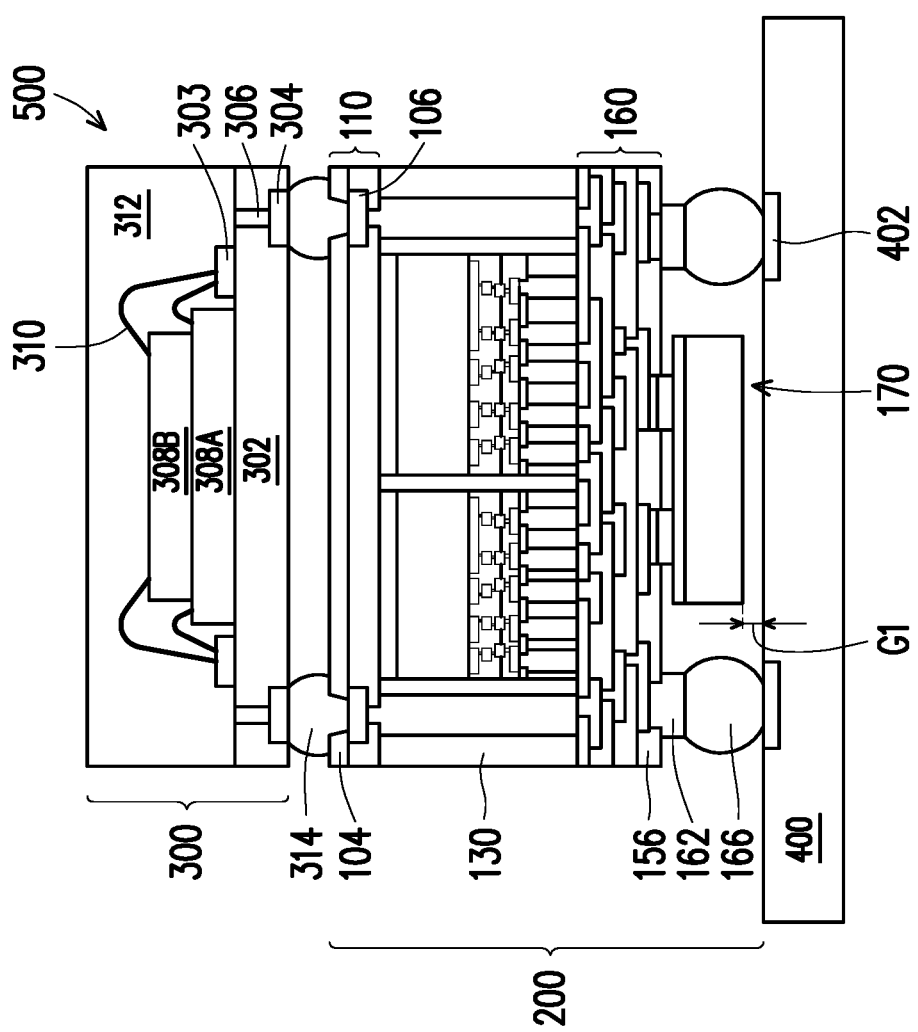

FIG. 26 illustrates a package structure 500 including the package 200 (may be referred to as a first package 200), a second package 300, and a substrate 400. The second package 300 includes a substrate 302 and one or more stacked dies 308 (308A and 308B) coupled to the substrate 302. The substrate 302 may be made of a semiconductor material such as silicon, germanium, diamond, or the like. In some embodiments, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 302 may be a SOI substrate. Generally, an SOI substrate includes a layer of a semiconductor material such as epitaxial silicon, germanium, silicon germanium, SOI, silicon germanium on insulator (SGOI), or combinations thereof. The substrate 302 is, in one alternative embodiment, based on an insulating core such as a fiberglass reinforced resin core. One example core material is fiberglass resin such as FR4. Alternatives for the core material include bismaleimide-triazine (BT) resin, or alternatively, other printed circuit board (PCB) materials or films. Build up films such as Ajinomoto build-up film (ABF) or other laminates may be used for substrate 302.

The substrate 302 may include active and passive devices (not shown). As one of ordinary skill in the art will recognize, a wide variety of devices such as transistors, capacitors, resistors, combinations of these, and the like may be used to generate the structural and functional requirements of the design for the semiconductor package 300. The devices may be formed using any suitable methods.

The substrate 302 may also include metallization layers (not shown) and through vias 306. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the substrate 302 is substantially free of active and passive devices.

The substrate 302 may have bond pads 303 on a first side the substrate 302 to couple to the stacked dies 308, and bond pads 304 on a second side of the substrate 302, the second side being opposite the first side of the substrate 302, to couple to the conductive connectors 314. In some embodiments, the bond pads 303 and 304 are formed by forming recesses (not shown) into dielectric layers (not shown) on the first and second sides of the substrate 302. The recesses may be formed to allow the bond pads 303 and 304 to be embedded into the dielectric layers. In other embodiments, the recesses are omitted as the bond pads 303 and 304 may be formed on the dielectric layer. In some embodiments, the bond pads 303 and 304 include a thin seed layer (not shown) made of copper, titanium, nickel, gold, palladium, the like, or a combination thereof. The conductive material of the bond pads 303 and 304 may be deposited over the thin seed layer. The conductive material may be formed by an electrochemical plating process, an electroless plating process, CVD, ALD, PVD, the like, or a combination thereof. In an embodiment, the conductive material of the bond pads 303 and 304 is copper, tungsten, aluminum, silver, gold, the like, or a combination thereof.

In an embodiment, the bond pads 303 and 304 are UBMs that include three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 303 and 304. Any suitable materials or layers of material that may be used for the UBMs 303 and 304 are fully intended to be included within the scope of the current application. In some embodiments, the through vias 306 extend through the substrate 302 and couple at least one bond pad 303 to at least one bond pad 304.

In the illustrated embodiment, the stacked dies 308 are coupled to the substrate 302 by wire bonds 310, although other connections may be used, such as conductive bumps. In an embodiment, the stacked dies 308 are stacked memory dies. For example, the stacked memory dies 308 may include low-power (LP) double data rate (DDR) memory modules, such as LPDDR1, LPDDR2, LPDDR3, LPDDR4, or the like memory modules.

In some embodiments, the stacked dies 308 and the wire bonds 310 may be encapsulated by a molding material 312. The molding material 312 may be molded on the stacked dies 308 and the wire bonds 310, for example, using compression molding. In some embodiments, the molding material 312 is a molding compound, a polymer, an epoxy, silicon oxide filler material, the like, or a combination thereof. A curing step may be performed to cure the molding material 312, wherein the curing may be a thermal curing, a UV curing, the like, or a combination thereof.

In some embodiments, the stacked dies 308 and the wire bonds 310 are buried in the molding material 312, and after the curing of the molding material 312, a planarization step, such as a grinding, is performed to remove excess portions of the molding material 312 and provide a substantially planar surface for the second packages 300.

After the second packages 300 are formed, the packages 300 are bonded to the first packages 200 by way of conductive connectors 314, the bond pads 304, and the metallization pattern 106. In some embodiments, the stacked memory dies 308 may be coupled to the integrated circuit dies 114 through the wire bonds 310, the bond pads 303 and 304, through vias 306, the conductive connectors 314, and the through vias 112.

The conductive connectors 314 may be similar to the conductive connectors 166 described above and the description is not repeated herein, although the conductive connectors 314 and 166 need not be the same. In some embodiments, before bonding the conductive connectors 314, the conductive connectors 314 are coated with a flux (not shown), such as a no-clean flux. The conductive connectors 314 may be dipped in the flux or the flux may be jetted onto the conductive connectors 314. In another embodiment, the flux may be applied to the surfaces of the metallization patterns 106.

In some embodiments, the conductive connectors 314 may have an epoxy flux (not shown) formed thereon before they are reflowed with at least some of the epoxy portion of the epoxy flux remaining after the second package 300 is attached to the first package 200. This remaining epoxy portion may act as an underfill to reduce stress and protect the joints resulting from the reflowing the conductive connectors 314. In some embodiments, an underfill (not shown) may be formed between the second package 300 and the first package 200 and surrounding the conductive connectors 314. The underfill may be formed by a capillary flow process after the second package 300 is attached or may be formed by a suitable deposition method before the second package 300 is attached.

The bonding between the second package 300 and the first package 200 may be a solder bonding or a direct metal-tometal (such as a copper-to-copper or tin-to-tin) bonding. In an embodiment, the second package 300 is bonded to the first package 200 by a reflow process. During this reflow process, the conductive connectors 314 are in contact with the bond pads 304 and the metallization patterns 106 to physically and electrically couple the second package 300 to the first package 200. After the bonding process, an IMC (not shown) may form at the interface of the metallization patterns 106 and the conductive connectors 314 and also at the interface between the conductive connectors 314 and the bond pads 304 (not shown).

The semiconductor package 500 includes the packages 200 and 300 being mounted to a substrate 400. The substrate 400 may be referred to a package substrate 400. The package 200 is mounted to the package substrate 400 using the conductive connectors 166. With the package 200 mounted to the substrate 400, the IPD component(s) 170 are interposed between the redistribution structure 160 of the package 200 and the substrate 400. The IPD component(s) 170 may be separated from the substrate 170 by a gap G1, which may be controlled by the improvements of the present disclosure.

The package substrate 400 may be made of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the package substrate 400 may be a SOI substrate. Generally, an SOI substrate includes a layer of a semiconductor material such as epitaxial silicon, germanium, silicon germanium, SOI, SGOI, or combinations thereof. The package substrate 400 is, in one alternative embodiment, based on an insulating core such as a fiberglass reinforced resin core. One example core material is fiberglass resin such as FR4. Alternatives for the core material include bismaleimide-triazine BT resin, or alternatively, other PCB materials or films. Build up films such as ABF or other laminates may be used for package substrate 400.

The package substrate 400 may include active and passive devices (not shown in FIG. 22). As one of ordinary skill in the art will recognize, a wide variety of devices such as transistors, capacitors, resistors, combinations of these, and the like may be used to generate the structural and functional requirements of the design for the semiconductor package 500. The devices may be formed using any suitable methods.

The package substrate 400 may also include metallization layers and vias (not shown) and bond pads 402 over the metallization layers and vias. The metallization layers may be formed over the active and passive devices and are designed to connect the various devices to form functional circuitry. The metallization layers may be formed of alternating layers of dielectric (e.g., low-k dielectric material) and conductive material (e.g., copper) with vias interconnecting the layers of conductive material and may be formed through any suitable process (such as deposition, damascene, dual damascene, or the like). In some embodiments, the package substrate 400 is substantially free of active and passive devices.

In some embodiments, the conductive connectors 166 can be reflowed to attach the package 200 to the bond pads 402. The conductive connectors 166 electrically and/or physically couple the substrate 400, including metallization layers in the substrate 400, to the first package 200.

The conductive connectors 166 may have an epoxy flux (not shown) formed thereon before they are reflowed with at least some of the epoxy portion of the epoxy flux remaining after the package 200 is attached to the substrate 400. This remaining epoxy portion may act as an underfill to reduce stress and protect the joints resulting from the reflowing the conductive connectors 166. In some embodiments, an underfill (not shown) may be formed between the first package 200 and the substrate 400 and surrounding the conductive connectors 166 and the IPD component 170. The underfill may be formed by a capillary flow process after the package 200 is attached or may be formed by a suitable deposition method before the package 200 is attached.

Embodiments of the present disclosure include a package structure including an IPD design that increases system performance and enlarges the process window to improve reliability and joint yield of the package structure. The package structures may include a fan-out or fan-in package and may include one or more redistribution layers (RDLs). The IPD component may be bonded to the one or more RDLs of the package structure. The IPD component may be bonded to the one or more RDLS adjacent a conductive joint that couples and bonds two packages/substrates together. The adjacent conductive joint may include an under bump metallization (UBM) on the one or more RDLs and a solder joint coupled to the UBM. The IPD component may be bonded to the one or more RDLs without any UBM. By removing the UBM under the IPD component joint area, the total height of the IPD component is reduced and the process window is enlarged.

An embodiment is a structure including a first die, a molding compound at least laterally encapsulating the first die, a first redistribution structure including metallization patterns extending over the first die and the molding compound, a first conductive connector comprising a solder ball and an under bump metallization coupled to the first redistribution structure, and an integrated passive device bonded to a first metallization pattern in the first redistribution structure with a micro bump bonding joint, the integrated passive device being adjacent the first conductive connector.

Another embodiment is a method including forming a first package including forming an electrical connector over a carrier substrate, attaching a first die to the carrier substrate, the electrical connector extending from a second side of the first die to a first side of the first die, the second side being opposite the first side, the electrical connector being adjacent the first die, encapsulating the first die and the electrical connector with a molding compound, forming a redistribution structure overlying the first side of the first die and the molding compound, the redistribution structure comprising metallization patterns, coupling a first conductive connector comprising an under bump metallization to a first metallization pattern of the redistribution structure, and bonding an integrated passive device to a second metallization pattern of the redistribution structure with a bonding joint.

A further embodiment is a method including forming a first through via adjacent a first die, the first through via extending from a second side of the first die to a first side of the first die, the second side being opposite the first side, encapsulating the first through via and the first die with a molding material, forming a first redistribution structure over the first side of the first die, the first through via, and the molding material, the first redistribution structure comprising multiple metallization patterns and multiple dielectric layers, forming a first under bump metallization over and through a first dielectric layer of the first redistribution structure to contact a first metallization pattern of the first redistribution structure, and bonding an integrated passive device to a second metallization pattern of the first redistribution structure with a bonding joint, the bonding joint extending through the first dielectric layer of the first redistribution structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a first package comprising:
        forming an electrical connector over a carrier substrate;
        attaching a first die to the carrier substrate, the electrical connector extending from a second side of the first die to a first side of the first die, the second side being opposite the first side, the electrical connector being adjacent the first die;
        encapsulating the first die and the electrical connector with a molding compound;
        forming a redistribution structure overlying the first side of the first die and the molding compound, the redistribution structure comprising metallization patterns;
        coupling a first conductive connector to a first metallization pattern of the redistribution structure, the first conductive connector comprising an under bump metallization contacting the first metallization pattern and comprising a connector overlying the under bump metallization, wherein the under bump metallization has a first height measured between an uppermost surface of the under bump metallization facing away from the first die and a lowermost surface of the under bump metallization contacting the first metallization pattern; and
        bonding an integrated passive device to a second metallization pattern of the redistribution structure with a bonding joint, the bonding joint comprising a conductive bump of the integrated passive device and a solder material on a first end of the conductive bump distal the integrated passive device, wherein there is an interface between the conductive bump and the solder material, and the first end of the conductive bump extends into a first dielectric layer of the redistribution structure, wherein the solder material contacts the second metallization pattern of the redistribution structure, wherein the bonding joint has a second height measured between an upper surface of the conductive bump facing away from the first die and a lower surface of the solder material contacting the second metallization pattern, wherein the first height is larger than the second height by 20 μm or more.

2. The method of claim 1 further comprising:
    bonding a second package to the first package using a second set of conductive connectors, the second package being proximate the second side of the first die.

3. The method of claim 1 further comprising:
    patterning the first dielectric layer to form a first opening to expose a first portion of the second metallization pattern, the bonding joint being within the first opening.

4. The method of claim 3, wherein the first opening is wider than the second metallization pattern.

5. The method of claim 3, wherein the first opening is narrower than the second metallization pattern.

6. The method of claim 3, wherein sidewalls of the first opening taper from a top surface of the first dielectric layer towards the second metallization pattern, wherein the sidewalls of the first opening are non-linear and comprise a plurality of recesses.

7. The method of claim 3, wherein patterning the first dielectric layer to form the first opening comprises performing a laser drilling process or photolithography to form the first opening.

8. The method of claim 1 further comprising:
    forming underfill between the redistribution structure and the integrated passive device, the underfill surrounding the bonding joint.

9. The method of claim 1 further comprising:
    bonding a substrate to the first package using the first conductive connector, wherein after the bonding, the integrated passive device is interposed between the redistribution structure and the substrate.

10. The method of claim 1, wherein the first metallization pattern is at a same level in the redistribution structure as the second metallization pattern.

11. The method of claim 1, wherein the conductive bump and the solder material of the bonding joint have a same width such that first sidewalls of the conductive bump are aligned with respective second sidewalls of the solder material.

12. The method of claim 11, wherein the under bump metallization has an upper portion disposed over an upper surface of the first dielectric layer and has a lower portion disposed inside the first dielectric layer, wherein the upper portion has a flat upper surface facing away from the first dielectric layer, wherein the connector is formed on the flat upper surface of the upper portion of the under bump metallization.

13. A method comprising:
    forming a first electrical connector adjacent a first die, the first electrical connector extending from a second side of the first die to a first side of the first die, the second side being opposite the first side;
    encapsulating the first electrical connector and the first die with a molding material, the encapsulated first electrical connector forming a first through via;
    forming a first redistribution structure over the first side of the first die, the first through via, and the molding material, the first redistribution structure comprising multiple metallization patterns and multiple dielectric layers;
    forming a first under bump metallization over and through a first dielectric layer of the first redistribution structure to contact a first metallization pattern of the first redistribution structure, an uppermost surface of the first under bump metallization facing away from the first redistribution structure extends above the first metallization pattern by a first height;
    forming a connector on the first under bump metallization; and
    bonding an integrated passive device to a second metallization pattern of the first redistribution structure with a bonding joint, the bonding joint extending into the first dielectric layer of the first redistribution structure, the bonding joint comprising a conductive bump and a solder layer on the conductive bump, a first surface of the solder layer contacting the conductive bump, a second surface of the solder layer contacting the second metallization pattern, the first surface of the solder layer being closer to the second metallization pattern than a first surface of the first dielectric layer distal the first die, an uppermost surface of the conductive bump facing away from the first redistribution structure extends above the second metallization pattern by a second height, the first height being larger than the second height by at least 20 μM.

14. The method of claim 13 further comprising:
patterning the first dielectric layer of the first redistribution structure to form a first opening to expose a first portion of the second metallization pattern, the bonding joint being within the first opening.

15. The method of claim 14, wherein the first opening is wider than the second metallization pattern.

16. The method of claim 14, wherein the first opening is narrower than the second metallization pattern.

17. The method of claim 14, wherein sidewalls of the first opening taper from a top surface of the first dielectric layer towards the second metallization pattern.

18. A method comprising:
forming a first package comprising:
forming an electrical connector over a carrier substrate;
attaching a first die to the carrier substrate, the electrical connector extending from a second side of the first die to a first side of the first die, the second side being opposite the first side, the electrical connector being adjacent the first die;
encapsulating the first die and the electrical connector with a molding compound;
forming a redistribution structure overlying the first side of the first die and the molding compound, the redistribution structure comprising metallization patterns and dielectric layers;
forming a first under bump metallization over and through a first dielectric layer of the redistribution structure to contact a first metallization pattern of the redistribution structure, the first under bump metallization having a first height measured between a first surface of the first under bump metallization contacting the first metallization pattern and a second opposing surface of the first under bump metallization;
coupling a first conductive connector to the first under bump metallization;
bonding an integrated passive device to a second metallization pattern of the redistribution structure with a bonding joint, the bonding joint extending through the first dielectric layer of the redistribution structure, the bonding joint comprising a micro bump and a solder layer on the micro bump, the solder layer contacting the second metallization pattern of the redistribution structure, a first surface of the solder layer furthest from the second metallization pattern being closer to the second metallization pattern than an outermost surface of the first dielectric layer, the bonding joint having a second height measured between a second surface of the solder layer contacting the second metallization pattern and a first surface of the micro bump facing away from the first die, wherein the first height is larger than the second height, and a difference between the first height and the second height is greater than about 20 μm; and
after bonding the integrated passive device, removing the carrier substrate; and
bonding a substrate to the first package using the first conductive connector, wherein after bonding the substrate, the integrated passive device is interposed between the redistribution structure and the substrate.

19. The method of claim 18, wherein bonding the integrated passive device comprises forming an opening in the first dielectric layer of the redistribution structure to expose the second metallization pattern, wherein the bonding joint extends through the opening in the first dielectric layer to bond with the second metallization pattern.

* * * * *